United States Patent
Sato et al.

(10) Patent No.: US 7,720,233 B2
(45) Date of Patent: May 18, 2010

(54) SIGNAL PROCESSING METHOD AND APPARATUS

(75) Inventors: Miki Sato, Tokyo (JP); Akihiko Sugiyama, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/570,392

(22) PCT Filed: Aug. 31, 2004

(86) PCT No.: PCT/JP2004/012543

§ 371 (c)(1),
(2), (4) Date: Mar. 2, 2006

(87) PCT Pub. No.: WO2005/024787

PCT Pub. Date: Mar. 17, 2005

(65) Prior Publication Data

US 2007/0071253 A1    Mar. 29, 2007

(30) Foreign Application Priority Data

Sep. 2, 2003    (JP) .............................. 2003-309917

(51) Int. Cl.
*G10K 11/16* (2006.01)
*H04B 15/00* (2006.01)
(52) U.S. Cl. ................ 381/71.11; 381/71.1; 381/71.12; 381/94.1; 381/94.2
(58) Field of Classification Search ............. 381/71.11, 381/17, 18, 71.1, 71.12, 94.1, 94.2, 94.3; 379/406.08; 708/322
See application file for complete search history.

(56) References Cited

U.S. PATENT DOCUMENTS 5,475,632 A * 12/1995 Sugiyama .................... 708/819

(Continued)

FOREIGN PATENT DOCUMENTS

JP    61-194913    8/1986

(Continued)

OTHER PUBLICATIONS

Bernard Widrow et al., "Adaptive Noise Cancelling: Principles and Applications", Proceedings of the IEEE, vol. 63, No. 12, pp. 1692-1716 (Dec. 1975).

(Continued)

*Primary Examiner*—Vivian Chin
*Assistant Examiner*—George C Monikang
(74) *Attorney, Agent, or Firm*—Scully, Scott, Murphy & Presser, P.C.

(57) ABSTRACT

A signal processor includes: a first adaptive filter that takes a first signal as input and generates a first pseudo signal; a first subtractor that subtracts the first pseudo signal from a second signal to supply a first differential signal as output; a second adaptive filter that takes the first signal as input to generate a second pseudo signal; a second subtractor that subtracts the second pseudo signal from the second signal to supply a second differential signal as output; a first step size control circuit that generates a first step size used in updating the first adaptive filter in accordance with the relation between the second pseudo signal and the second differential signal; and a second step size control circuit that generates a second step size used in updating the second adaptive filter in accordance with the relation between the first signal and the second signal.

46 Claims, 11 Drawing Sheets

U.S. PATENT DOCUMENTS

| | | | |
|---|---|---|---|
| 6,449,586 B1 * | 9/2002 | Hoshuyama | 702/190 |
| 6,636,474 B1 * | 10/2003 | Tanaka et al. | 369/275.3 |
| 6,678,376 B1 * | 1/2004 | Takahashi et al. | 379/406.01 |
| 7,162,420 B2 * | 1/2007 | Zangi et al. | 704/226 |

FOREIGN PATENT DOCUMENTS

| | | |
|---|---|---|
| JP | 61-194914 | 8/1986 |
| JP | 62-135019 | 6/1987 |
| JP | 05-022788 | 1/1993 |
| JP | 05-075391 | 3/1993 |
| JP | 05-158494 | 6/1993 |
| JP | 06-090493 | 3/1994 |
| JP | 06-284491 | 10/1994 |
| JP | 07-199990 | 8/1995 |
| JP | 08-056180 | 2/1996 |
| JP | 08-110794 | 4/1996 |
| JP | 08-241086 | 9/1996 |
| JP | 09-018291 | 1/1997 |
| JP | 09-036763 | 2/1997 |
| JP | 09-181653 | 7/1997 |
| JP | 10-003298 | 1/1998 |
| JP | 10-207490 | 8/1998 |
| JP | 10-215193 | 8/1998 |
| JP | 10-215194 | 8/1998 |
| JP | 11-027099 | 1/1999 |
| JP | 11-041687 | 2/1999 |
| JP | 11-502324 | 2/1999 |
| JP | 11-345000 | 12/1999 |
| JP | 2000-004494 | 1/2000 |
| JP | 2000-172299 | 6/2000 |
| JP | 2001-195085 | 7/2001 |
| JP | 2002-171591 | 6/2002 |
| JP | 2002-207500 | 7/2002 |
| JP | 2002-258898 | 9/2002 |
| JP | 2002-366191 | 12/2002 |
| WO | WO/97/23068 | 6/1997 |

OTHER PUBLICATIONS

Jin-Ichi Nagumo et al., "A Learning Method for System Identification", IEEE Transactions on Automatic Control, vol. AC-12, No. 3, pp. 282-287 (Jun. 1967).

Shigeji Ikeda et al., "An Adaptive Noise Canceller with Low Signal Distortion for Speech Codecs", IEEE Transactions on Signal Processing, vol. 47 No. 3, pp. 665-674 (Mar. 1999).

Shigeji Ikeda et al., "An Adaptive Noise Canceller with Low Signal-Distortion in the Presence of Crosstalk", IEICE Trans. Fundamentals, vol. E82 A, No. 8, pp. 1517-1525 (Aug. 1999).

David G. Messerschmitt, Fellow IEEE,"Echo Cancellation in Speech and Data Transmission", IEEE Journal on Selected Areas in Communications, vol. Sac-2, No. 2, pp. 283-297 (Mar. 1984).

John J. Shynk, "Frequency- Domain and Multirate Adaptive Filtering", IEEE SP Magazine, pp. 14-25 ( Jan. 1992).

* cited by examiner

_US 7,720,233 B2_

SIGNAL PROCESSING METHOD AND APPARATUS

TECHNICAL FIELD

The present invention relates to a signal processing method and signal processing device, and more particularly to a method and device for eliminating other signals that are mixed with a desired signal that has been received from a microphone, handset, or communication path, or for accentuating a desired signal of this type.

BACKGROUND ART

Speech signals received from a device such as a microphone or handset are subjected to speech encoding or a speech recognition process. Background noise signals mixed with these speech signals pose a serious problem when implementing speech encoding or speech recognition in a narrow-band speech encoder having a high degree of information compression, a speech recognition device, or the like. Two-input noise cancellers employing adaptive filters are disclosed in References [1] to [9] and [23] as signal processors directed toward eliminating thus acoustically superposed noise components.

A two-input noise canceller operates by using an adaptive filter, which approximates the impulse response of the path (noise path) which is traveled by a noise signal that has been applied as input to the reference input terminal until the signal reaches the speech input terminal, to generate a pseudo noise signal corresponding to the noise signal component which is mixed at the speech input terminal, and then, by subtracting this pseudo noise signal from the received sound signal which is received as input at the speech input terminal, suppresses the noise signal. The received sound signal is a signal in which a speech signal and noise signal are mixed, this received sound signal typically being a signal that is applied as input to the speech input terminal from a microphone or handset. At this time, the filter coefficient of an adaptive filter is corrected by taking the relation between an error signal obtained by subtracting the pseudo noise signal from the received sound signal and the reference signal applied as input to the reference input terminal.

Known coefficient correction algorithms for this adaptive filter include the "LMS algorithm (Least-Mean-Square Algorithm)" described in Reference [23] and the "LIM (Learning Identification Method)" described in Reference [24].

FIG. 1 shows a representative configuration of a two-input noise canceller of the prior art. This noise canceller is provided with two input terminals 101, 102, adaptive filter 107, subtractor 111, and output terminal 113.

A signal which has undergone acousto-electrical conversion by a microphone placed close to the speaker is applied to input terminal 101. Signal $X_P(k)$ that has been applied as input is a signal in which background noise signal n(k) is mixed with the speech signal S(k) which is the object signal and can be represented by Equation (1):

$$X_P(k)=S(k)+n(k) \qquad (1)$$

A signal that has undergone acousto-electrical conversion by a microphone placed at a position which is farther from the speaker than for input terminal 101 is applied to input terminal 102. If the microphone connected to input terminal 102 is in a position that is sufficiently remote from the speaker and sufficiently close to the source of noise, signal $X_r(k)$ applied as input to input terminal 102 is equivalent to background noise signal N(k) applied as input to input terminal 101, resulting in Equation (2):

$$X_r(k)=N(k) \qquad (2)$$

Adaptive filter 107 performs a filtering operation taking as input signal $X_r(k)$ applied to input terminal 102 and supplies pseudo noise signal R(k) as the operation result.

Subtractor 111 subtracts pseudo noise signal R(k) which is supplied by adaptive filter 107 from signal $X_P(k)$ which is applied to input terminal 101 to generate differential signal e(k), and both transfers differential signal e(k) to output terminal 113 as the output signal of the noise canceller and supplies the differential signal e(k) to adaptive filter 107 as the error signal for updating the coefficient of adaptive filter 107. Differential signal e(k) is given by the following Equation (3):

$$e(k)=S(k)+n(k)-R(k) \qquad (3)$$

Based on the error signal received as input, adaptive filter 107 uses the coefficient correction algorithm to update the coefficient of the filter. Assuming here that the LMS algorithm described in Reference [23] is employed as the coefficient update algorithm of the adaptive filter and taking $w_j(k)$ as the $j^{th}$ coefficient of adaptive filter 107 at time k, the pseudo noise signal R(k) which is supplied as output by adaptive filter 107 is represented by Equation (4):

$$R(k) = \sum_{j=0}^{N-1} W_j(k) \cdot X_r(k-j) \qquad (4)$$

Here, N indicates the number of taps of adaptive filter 107. The updating of the coefficient is realized according to Equation (5):

$$w_j(k+1)=w_j(k)+\alpha \cdot e(k) \cdot X_r(k-j) \qquad (5)$$

In this case, α is a constant referred to as the "step size" and is a parameter for determining the convergence time of the coefficient and the residual error after the convergence. When step size α is large, the amount of correction of the coefficient increases and the convergence is therefore fast, but fluctuation of the coefficient also increases in the vicinity of the optimum value and the final residual error becomes great. In contrast, when the step size α is small, the time required for convergence increases, but the final residual error becomes small.

As shown in Equation (3), error signal e(k) contains speech signal S(k), and because the coefficient update operation is carried out such that e(k)=0, the coefficient update operation is not carried out such that R(k)=n(k) when S(k)≠0. As a result, speech signal S(k) has a large influence as a disturbance signal for the coefficient update operation of adaptive filter 107. To reduce the influence of speech signal S(k), step size α must be set to an extremely small value. However, as stated above decreasing the step size raises the problem of increase in the convergence time of adaptive filter 107.

As a method that takes this problem into consideration, References [10]-[19] and [25] disclose noise cancellers which implement control of the step size.

FIG. 2 shows the configuration of an adaptive noise canceller of the prior art for implementing control of step size which is described in Reference [25]. As shown in FIG. 2, this prior-art device is provided with two adaptive filters 5, 7 and uses the signal-to-noise (S/N) ratio at input terminal 1 which is estimated by using adaptive filter 5 to control the step size of adaptive filter 7. Implementing control such that the step size is small when the speech signal is greater than the noise signal and the step size is large in the opposite state enables a shortening of the convergence time of adaptive filter 7 and a decrease of the distortion in the signal following noise cancellation that is transferred to output terminal 13. This noise canceller is further provided with: two delay circuits 3, 4; two subtractors 9, 11; step size control circuit 19; and S/N estimation circuit 21.

The operation of adaptive filter 5 is equivalent to the operation of adaptive filter 107 in the device shown in the previously described FIG. 1. Accordingly, the estimated value of the speech signal component from which the influence of noise in input terminal 1 has been eliminated and the estimated value of the noise signal component at input terminal 1 are supplied to S/N ratio estimation circuit 21. This input is realized because the input of S/N ratio estimation circuit 21 is the output of subtractor 9 which approximates the speech component at input terminal 1 and the output of adaptive filter 5 which approximates the noise component. The S/N ratio estimation circuit is also referred to as a signal-to-noise power relation estimation circuit.

In S/N ratio estimation circuit 21, the estimated value of the signal-to-noise ratio is found by using the estimated value of the speech signal component and the estimated value of the noise signal component which are supplied thereto. The signal-to-noise ratio found in S/N ratio estimation circuit 21 is supplied to step size control circuit 19, and the thus-obtained step size is supplied to adaptive filter 7.

In contrast to adaptive filter 107 of FIG. 1, the input signal to adaptive filter 7 is the signal supplied to input terminal 2 delayed by delay circuit 4. Similarly, the signal supplied from input terminal 1 to subtractor 11, in contrast to subtractor 111 of the circuit shown in FIG. 1, is a signal that has been delayed by delay circuit 3. Delay circuits 3, 4 produce a delay of the same time interval, and are configured such that the noise cancellation realized by adaptive filter 7 is applied to signals realized by delaying the signals supplied to input terminals 1, 2 by the same time interval. The delay time which is produced by delay circuit 3 and the delay time which is produced by delay circuit 4 are set to a time interval that is at least the delay time resulting from the calculation of estimated values by S/N ratio estimation circuit 21. Subtractor 11 subtracts noise similar to subtractor 111 of the device shown in FIG. 1 and transfers the output to output terminal 13.

The configuration of S/N ratio estimation circuit 21 can be represented as shown in FIG. 3. S/N ratio estimation circuit 21 is composed of averaging circuits 14, 15 and operation circuit 16. Averaging circuit 14 is supplied with the estimated value of the speech signal component, calculates the average value of the estimated value of the speech signal component, and delivers the average value of the estimated speech signal. Similarly, averaging circuit 15 is supplied with the estimated value of the noise signal component, calculates the average value of the noise signal component, and delivers the average value of the estimated noise signal. The outputs of averaging circuits 14, 15 are both supplied to operation circuit 16. Operation circuit 16 uses the average value of the estimated speech signal component and the average value of the estimated noise signal component which are supplied from averaging circuits 14, 15 to find the estimated value of the average signal-to-noise ratio and supplies this value as the first signal-to-noise ratio.

Averaging circuits 14, 15 calculate the average power E(k) from time k-L to time k. If Y(k) is the input signal, the average power E(k) is given by Equation (6):

$$E(k) = \frac{1}{L}\sum_{i=0}^{L} Y^2(k-i) \tag{6}$$

Equation (7) may also be used in place of Equation (6):

$$E(k)=\gamma \cdot E(k-1)+(1-\gamma)\cdot Y^2(k) \tag{7}$$

where $\gamma$ is a constant that satisfies the relation $0<\gamma<1$.

Step size control circuit 19 supplies adaptive filter 7 with the step size that has been calculated based on the first signal-to-noise ratio that has been found by S/N ratio estimation circuit 21.

If the first signal-to-noise ratio at time k is SNR1(k), step size control circuit 19 receives SNR1(k) as input and calculates step size $\alpha_1(k)$.

$\alpha_1(k)$ is found as the value of function $f_1(x)$ that implements monotone decrease at $SNR1_{min}<SNR1(k)<SNR1_{max}$. In this case, $SNR1_{min}$ and $SNR1_{max}$ are constants satisfying the relation $SNR1_{min}<SNR1_{max}$.

This relation can be represented by Equations (8a) to (8c):

$$\alpha_1(k)=\alpha_{1max}$$

$$(SNR1(k)<SNR1_{min}) \tag{8a}$$

$$\alpha_1(k)=f_1(SNR1(k))$$

$$(SNR1_{min}\leq SNR1(k) \leq SNR1_{max}) \tag{8b}$$

$$\alpha_1(k)=\alpha_{1min}$$

$$(SNR1(k)>SNR1_{max}) \tag{8c}$$

In addition, $\alpha_{1min}$ and $\alpha_{1max}$ are constants satisfying the relation $\alpha_{1min}<\alpha_{max}$.

The monotone decrease function $f_1(x)$ can be represented by, for example, Equations (9a) to (9c).

$$f_1(x)=-A\cdot x+B \tag{9a}$$

$$A=(\alpha_{1max}-\alpha_{1min})/(SNR1_{max}-SNR1_{min}) \tag{9b}$$

$$B=\{\alpha_{1max}+\alpha_{1min}+A\cdot(SNR1_{max}+SNR1_{min})\}/2 \tag{9c}$$

According to the noise canceller described in Reference [25], second adaptive filter 5 can be used to estimate the signal-to-noise ratio at the speech input terminal and thus control the step size of first adaptive filter 7 such that the step size is small when the signal-to-noise ratio is large and the step size is large in the reverse situation. As a result, operation is enabled that mitigates the influence of the disturbance signal.

Nevertheless, when the signal supplied to input terminal 2 has not been collected at a position which is sufficiently remote from the speaker, signal $X_R(k)$ which is applied as input to input terminal 2 is a signal in which speech signal s(k) is mixed with background noise signal N(k) as shown in Equation (10), and a component having a correlation with speech signal s(k) appears in the output of the adaptive filter. As a result, not only does distortion occur in the signal which is transferred to output terminal 13, but error also occurs in the speech signal component which is supplied to S/N ratio estimation circuit 21.

$$X_R(k)=N(k)+s(k) \tag{10}$$

As noise cancellers that take this problem into consideration, References [20], [21] and [26] disclose noise cancellers which employ adaptive filters approximating the impulse response of the path taken by a speech signal until the signal reaches the reference input terminal. FIG. 4 shows the configuration of the noise canceller described in Reference [26].

The noise canceller shown in FIG. 4 is a device in which adaptive filters 6, 8, subtractors 10, 12, step size control circuit 20, and S/N ratio estimation circuit 22 have been added to the noise canceller shown in FIG. 2. In this noise canceller, a signal which corresponds to the speech signal that leaks to input terminal 2 is generated by adaptive filter 8, and the result of subtracting the output of adaptive filter 8 from the signal which is supplied to input terminal 2 is supplied to adaptive filter 7, where the disturbance of the speech signal which leaks to input terminal 2 is reduced. Adaptive filter 6 and S/N ratio estimation circuit 22 controls the step size of adaptive filter 8 in accordance with the same principle of the noise canceller shown in FIG. 2. In the device shown in FIG. 4, in contrast with the device shown in FIG. 2, the input signal to adaptive filter 7 is, an estimated value of the noise signal component from which the influence of speech has been removed. This result is obtained because the input of adaptive filter 7 is the output of subtractor 12 which approximates the noise component at input terminal 2. Similarly, in contrast with the device shown in FIG. 2, the input signal of adaptive filter 5 is the output of subtractor 10 in the device shown in FIG. 4.

The input signal of adaptive filter 8 is an estimated value of the speech signal component from which the influence of noise has been removed. This result is obtained because the input of adaptive filter 8 is the output of subtractor 11 which approximates the speech component at input terminal 1. Adaptive filter 8 performs a filtering operation on the signal supplied from subtractor 11 and supplies first pseudo speech signal as the operation result. Similarly, the input signal of adaptive filter 6 is the output of subtractor 9. Adaptive filter 6 performs a filtering operation on the signal supplied from subtractor 9 and delivers a second pseudo speech signal as the operation result.

Subtractor 12 subtracts the output of adaptive filter 8 from the output of delay circuit 4 and both supplies the result of subtraction to adaptive filter 7 and transmits the result to adaptive filter 8 as an error signal for updating the coefficient. Subtractor 10 subtracts the output of adaptive filter 6 from the signal supplied to input terminal 2 and both supplies the result of subtraction to adaptive filter 5 and transmits the result to adaptive filter 6 as an error signal for updating the coefficient.

An estimated value of the noise signal component from which the influence of speech at input terminal 2 has been removed and an estimated value of the speech signal component at input terminal 2 are supplied to S/N ratio estimation circuit 22. This is because the input of S/N ratio estimation circuit 22 is the output of subtractor 10 which approximates the noise component at input terminal 2 and the output of adaptive filter 6 which approximates the speech component. The configuration of S/N ratio estimation circuit 22 is equivalent to the configuration of S/N ratio estimation circuit 21 which was explained using FIG. 3. Accordingly, S/N ratio estimation circuit 22 uses the estimated value of the speech signal component and the estimated value of the noise signal component that have been supplied to find the estimated value of the signal-to-noise ratio, and supplies the result to step size control circuit 20 as the second signal-to-noise ratio.

Step size control circuit 20 supplies adaptive filter 8 with a step size that has been calculated based on the second signal-to-noise ratio that has been found in S/N ratio estimation circuit 22.

If the estimated value of the second signal-to-noise ratio at time k is SNR2(k), step size control circuit 20 receives SNR2(k) and calculates step size $\alpha_2(k)$.

$\alpha_2(k)$ is found as the value of function $f_2(x)$ that causes monotone increase at $SNR2_{min} < SNR2(k) < SNR2_{max}$. In this case, $SNR2_{min}$ and $SNR2_{max}$ are constants satisfying the relation $SNR2_{min} < SNR2_{max}$. This relation can be represented by Equations (11a) to (11c).

$$\alpha_2(k) = \alpha_{2min}$$
$$(SNR2(k) < SNR2_{min}) \quad (11a)$$

$$\alpha_2(k) = f_2(SNR2(k))$$
$$(SNR2_{min} \leq SNR2(k) \leq SNR2_{max}) \quad (11b)$$

$$\alpha_2(k) = \alpha_{2max}$$
$$(SNR2(k) > SNR2_{max}) \quad (11c)$$

$\alpha_{2min}$ and $\alpha_{2max}$ are constants satisfying the relation $\alpha_{2min} < \alpha_{2max}$.

The monotone increase function $f_2(x)$ can be represented by, for example, Equations (12a) to (12c).

$$f_2(x) = C \cdot x + D \quad (12a)$$

$$C = (\alpha_{2max} - \alpha_{2min})/(SNR2_{max} - SNR2_{min}) \quad (12b)$$

$$D = \{\alpha_{2max} + \alpha_{2min} - C \cdot (SNR2_{max} + SNR2_{min})\}/2 \quad (12c)$$

According to the noise canceller described in Reference [26], adaptive filter 8 is used to estimate the speech signal that leaks to the reference input terminal and this estimated value is subtracted in a subtractor to enable a reduction of the disturbance due to the speech signal that leaks to input terminal 2. In addition, the use of adaptive filter 6 to estimate the signal-to-noise ratio at the reference input terminal enables control of the step size of adaptive filter 8 such that a large step size is used when the signal-to-noise ratio is large and a small step size is used in the reverse situation to enable operation that reduces the influence of the disturbance signal.

The reference documents cited in this description are listed below:

[1] JP-A-H09-36763
[2] JP-A-H08-56180
[3] JP-A-H06-284491
[4] JP-A-H06-90493
[5] JP-A-H09-181653
[6] JP-A-H05-75391
[7] JP-A-H05-158494
[8] JP-A-H05-22788
[9] JP-A-S61-194914
[10] JP-A-20004494
[11] JP-A-2000-172299
[12] JP-A-H11-27099
[13] JP-A-H11-345000
[14] JP-A-H10-3298
[15] JP-A-H10-215193
[16] JP-A-H09-18291
[17] JP-A-H08-241086
[18] JP-A-S62-135019
[19] JP-A-S61-194913
[20] JP-A-H10-215194
[21] JP-A-H08-110794

[22] JP-A-H11-502324
[23] Bernard Widrow et. al, "Adaptive Noise Canceling: Principles and Applications," PROCEEDINGS OF IEEE, VOL. 63, NO. 12, 1975, pp. 1692-1716
[24] Jin-ichi Nagumo and Atsuhiko Noda, "A Learning Method for System Identification," IEEE Transactions on Automatic Control, VOL. 12, NO. 3, 1967, pp. 282-287
[25] Shigeji Ikeda and Akihiiko Sugiyama, "An Adaptive Noise Canceller with Low Signal Distortion for Speech Codec," IEEE TRANSACTIONS ON SIGNAL PROCESSING, VOL. 47, NO. 3, 1999, pp. 665-674
[26] Shigeji Ikeda and Akihiko Sugiyama, "An Adaptive Noise Canceller with Low Signal Distortion in the Presence of Crosstalk," IEICE TRANSACTIONS ON FUNDAMENTALS, VOL. E82-A, NO. 8, 1999, pp. 1517-1525
[27] David G. Messerschmitt, "Echo Cancellation in Speech and Data Transmission," IEEE Journal on Selected Areas in Communications, VOL. SAC-2, NO. 2, 1984, pp. 283-297
[28] John J. Shynk, "Frequency-Domain and Multirate Adaptive Filtering," IEEE Signal Processing Magazine, VOL. 9, NO. 1, pp. 14-37, 1992

DISCLOSURE OF THE INVENTION:

Problem to be Solved by the Invention:

The signal-to-noise ratio at the speech input terminal or reference input terminal varies over a broad range due to the environment in which a noise canceller is used and the arrangement of the speech input terminal and reference input terminal. For example, in the device of the prior art that was explained with reference to FIG. 4, the step sizes of updating of the coefficients of adaptive filters 5, 6 are fixed values, and the values of the signal-to-noise ratios at the speech input terminal or reference input terminal therefore causes increase in the convergence time or increase in the distortion in the output signals of subtractors 9, 10. This increase in convergence time or distortion degrades the accuracy of the estimated values of the speech component and noise component which are supplied to S/N ratio estimation circuits 21, 22 and produces an increase in the convergence time of adaptive filters 7, 8 or increases distortion in output speech that is supplied as output at output terminal 13.

It is therefore an object of the present invention to provide a signal processing method that realizes noise cancellation in which the convergence time is short and distortion of output speech is limited for input signals of a signal-to-noise ratio having a broad range at the speech input terminal or reference input terminal.

It is another object of the present invention to provide a signal processor that realizes noise cancellation having short convergence time and little distortion in output speech for input signals of signal-to-noise ratios having a broad range in a speech input terminal or reference input terminal.

Means for Solving the Problem

The signal processing method according to one aspect of the present invention is a method for using a first signal and a second signal that includes a desired signal to extract the desired signal, and includes the steps of: controlling the first signal process that, using the relation between the first signal and second signal, operates with the first signal and second signal as input; and controlling the second signal process that, using the results of the first signal process, operates with the first signal and second signal as input.

The signal processing method according to another aspect of the present invention includes the steps of: generating a first pseudo signal by means of a first adaptive filter that takes the first signal as input; generating a first differential signal by subtracting the first pseudo signal from the second signal; using the first differential signal to update the coefficient of the first adaptive filter; generating a second pseudo signal P by means of a second adaptive filter that takes the first signal as input; generating a second differential signal by subtracting the second pseudo signal from the second signal; using the second differential signal to update the coefficient of the second adaptive filter; using a first step size that is controlled in accordance with the relation between the second pseudo signal and the second differential signal to control updating of the coefficient of the first adaptive filter: using a second step size that is controlled in accordance with the relation between the first signal and the second signal to control updating of the coefficient of the second adaptive filter; and supplying the first differential signal as output.

The relation between the second pseudo signal and the second differential signal and the relation between the first signal and the second signal are typically represented by the signal-to-noise ratio.

The signal processing method according to another aspect of the present invention is a signal processing method that takes as input a first signal and a second signal, and includes the steps of: generating a first pseudo signal by means of a first adaptive filter that takes a first intermediate signal as input, generating a first differential signal by subtracting the first pseudo signal from the second signal, and using the first differential signal to update the coefficient of the first adaptive filter; generating a second pseudo signal by means of a second adaptive filter that takes a second intermediate signal as input, generating a second differential signal by subtracting the second pseudo signal from the second signal, and using the second differential signal to update the coefficient of the second adaptive filter; generating a third pseudo signal by means of a third adaptive filter that takes the first differential signal as input, generating a third differential signal by subtracting the third pseudo signal from the first signal, applying the third differential signal to the first adaptive filter as the first intermediate signal, and using the third differential signal to update the coefficient of the third adaptive filter; generating a fourth pseudo signal by means of a fourth adaptive filter that takes the second differential signal as input, generating a fourth differential signal by subtracting the fourth pseudo signal from the first signal, applying the fourth differential signal to the second adaptive filter as the second intermediate signal, and using the fourth differential signal to update the coefficient of the fourth adaptive filter; based on the relation between signals; using a first step size to control updating of the coefficient of the first adaptive filter, using a second step size to control the updating of the coefficient of the second adaptive filter, using a third step size to control updating of the coefficient of the third adaptive filter, and using a fourth step size to control updating of the coefficient of the fourth adaptive filter, and means for supplying the first differential signal as output.

According to one example of the present invention, the relations between signals are represented by signal-to-noise ratios, but indices other than the signal-to-noise ratios may also be used as the relation.

As one example of the relation between signals, the first step size is controlled in accordance with the relation between the second pseudo signal and the second differential signal; the second step size is controlled in accordance with the relation between the first signal and the second signal; the third step size is controlled in accordance with the relation between the fourth pseudo signal and the fourth differential signal; and the fourth step size is controlled in accordance with the relation between the first signal and the second signal. As another example, the first step size is controlled in accordance with the relation between the second pseudo signal and the second differential signal; the second step size is controlled in accordance with the relation between the first signal and the second signal; the third step size is controlled in accordance with the relation between the fourth pseudo signal and the fourth differential signal; and the fourth step size is controlled in accordance with the relation between the fourth pseudo signal and the fourth differential signal. In addition to these examples, there exists a multiplicity of combinations of signals that constitute the relations which are used to find each step size.

A signal processor according to yet another aspect of the present invention is a signal processor for receiving as input a first signal and a second signal that includes a desired signal and for extracting the desired signal; wherein the signal processor is provided with a calculation circuit for calculating the relation between the first signal and the second signal, a first signal processing means for receiving the first signal and the second signal as input, and a second signal processing means for receiving the first signal and the second signal, wherein the output of the calculation circuit is used to control the operation of the first signal processor, and the output of the first signal processing means is used to control the operation of the second signal processing means.

A signal processor according to yet another aspect of the present invention includes: a first adaptive filter for receiving a first signal as input and generating a first pseudo signal; a first subtractor for generating a first differential signal by subtracting the first pseudo signal from the second signal; a second adaptive filter for receiving the first signal as input and generating a second pseudo signal; a second subtractor for generating a second differential signal by subtracting the second pseudo signal from the second signal; a first step size control means for generating a first step size in accordance with the relation between the second pseudo signal and the second differential signal; and a second step size control means for generating a second step size in accordance with the relation between the first signal and the second signal; wherein the first differential signal and the first step size are used to update the coefficient of the first adaptive filter; the second differential signal and the second step size are used to update the coefficient of the second adaptive filter; and the first differential signal is supplied as output.

A signal processor according to yet another aspect of the present invention is a signal processor that takes a first signal and a second signal as input; and includes: a first adaptive filter for receiving a first intermediate signal as input and generating a first pseudo signal; a first subtractor for generating a first differential signal by subtracting the first pseudo signal from the second signal; a second adaptive filter for receiving a second intermediate signal as input and generating a second pseudo signal; a second subtractor for generating a second differential signal by subtracting the second pseudo signal from the second signal; a third adaptive filter for receiving the first differential signal as input and generating a third pseudo signal; a third subtractor for generating a third differential signal by subtracting the third pseudo signal from the first signal and supplying the third differential signal to the first adaptive filter as the first intermediate signal; a fourth adaptive filter for receiving the second differential signal as input and generating a fourth pseudo signal; a fourth subtractor for generating a fourth differential signal by subtracting the fourth pseudo signal from the first signal and supplying the fourth differential signal to the second adaptive filter as the second intermediate signal; and a step size control means for generating a first step size, a second step size, a third step size and a fourth step size based on the relations between the signals; wherein the first differential signal and the first step size are used to update the coefficient of the first adaptive filter, the second differential signal and the second step size are used to update the coefficient of the second adaptive filter, the third differential signal and the third step size are used to update the coefficient of the third adaptive filter, the fourth differential signal and the fourth step size are used to update the coefficient of the fourth adaptive filter, and the first differential signal is supplied as output.

According to the present invention, by estimating signal-to-noise ratios, operating adaptive filters having step sizes which are appropriately controlled through the use of the estimated values of the signal-to-noise ratios, and using the signal-to-noise ratios estimated based on the output signal of the adaptive filters to determine the step sizes of other adaptive filters, signal processing having short convergence time, and moreover, having little distortion in output speech can be realized for an input signal having a signal-to-noise ratio that varies over a broad range at a speech input terminal or reference input terminal.

BEST MODE FOR CARRYING OUT THE INVENTION

The following explanation regards the best modes of working the present invention. The following explanation takes as an example a form of a signal processor according to the present invention that is realized as a device for processing speech signals, and in particular, as a noise canceller. Nevertheless, it will be obvious that the signal processors of each of the following embodiments can be used as various types of signal processors other than noise cancellers without altering the configuration of the signal processors.

Figure 5:
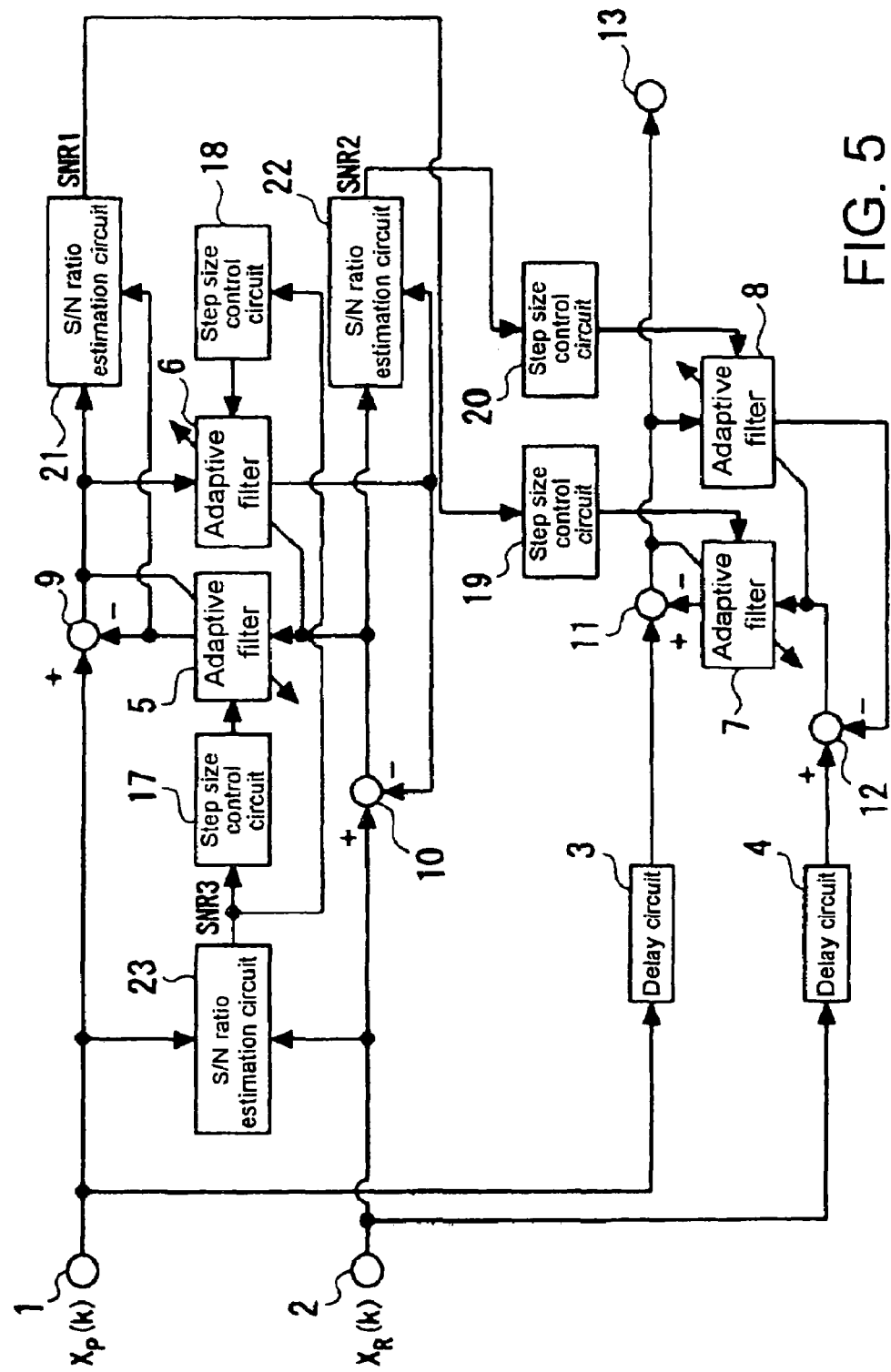
FIG. 5 is a block diagram showing the configuration of the signal processor according to the first embodiment of the present invention.

The signal processor of the first embodiment of the present invention shown in FIG. 5 is provided with: speech input terminal 1; reference input terminal 2; output terminal 13; first delay circuit 3 for receiving first received sound signal $X_P(k)$ which is received from speech input terminal 1 and conferring to the first received sound signal a delay time that has been determined in advance to generate a first delayed received sound signal; second delay circuit 4 for receiving a second received sound signal $X_R(k)$ which is received from reference input terminal 2, giving the second received sound signal a delay time that is the same as that of first delay circuit 3 to generate a second delayed received sound signal; first subtractor 11 for subtracting a first pseudo noise signal from the first delayed received sound signal to generate a first error signal; a second subtractor 12 for subtracting the first pseudo speech signal from the second delayed received sound signal to generate a second error signal; a first adaptive filter 7 for taking the second error signal as input to generate the first pseudo noise signal and update the coefficient such that the first error signal is minimized; and a second adaptive filter 8 for taking the first error signal as input to generate the first pseudo speech signal and update the coefficient such that the second error signal is minimized. The first error signal from first subtractor 11 is also supplied to output terminal 13 as a speech signal from which noise has been cancelled.

The signal processor shown in FIG. 5 is further provided with: third subtractor 9 for subtracting a second pseudo noise signal from the first received sound signal to generate a third error signal; fourth subtractor 10 for subtracting the second pseudo speech signal from the second received sound signal to generate a fourth error signal; third adaptive filter 5 for taking the fourth error signal as input to generate the second pseudo noise signal and update the coefficient such that the third error signal is minimized; fourth adaptive filter 6 for taking the third error signal as input to generate the second pseudo speech signal and update the coefficient such that the fourth error signal is minimized: first S/N ratio estimation circuit 21 for generating a first signal-to-noise relation from the third error signal and the second pseudo noise signal; second S/N ratio estimation circuit 22 for generating a second signal-to-noise relation from the second pseudo speech signal and the fourth error signal; third S/N ratio estimation circuit 23 for generating a third signal-to-noise relation from the first received sound signal and the second received sound signal; first step size control circuit 19 for supplying as output a step size for determining the amount of correction of the filter coefficient of first adaptive filter 7 based on the first signal-to-noise relation; second step size control circuit 20 for supplying as output a step size for determining the amount of correction of the filter coefficient of second adaptive filter 8 based on the second signal-to-noise relation; third step size control circuit 17 for supplying as output a step size for determining the amount of correction of the filter coefficient of third adaptive filter 5 based on the third signal-to-noise relation; and fourth step size control circuit 18 for supplying as output a step size for determining the amount of correction of the filter coefficient of fourth adaptive filter 6 similarly based on the third signal-to-noise relation.

Figure 1:
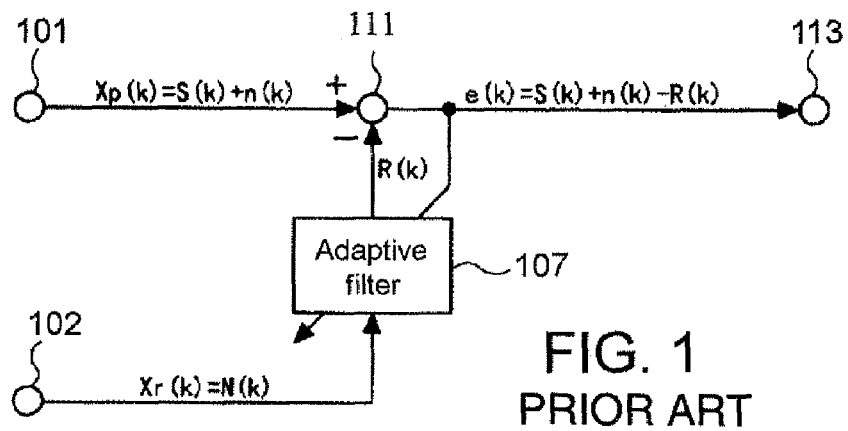
FIG. 1 is a block diagram showing an example of the configuration of a signal processor of the prior art.
Figure 2:
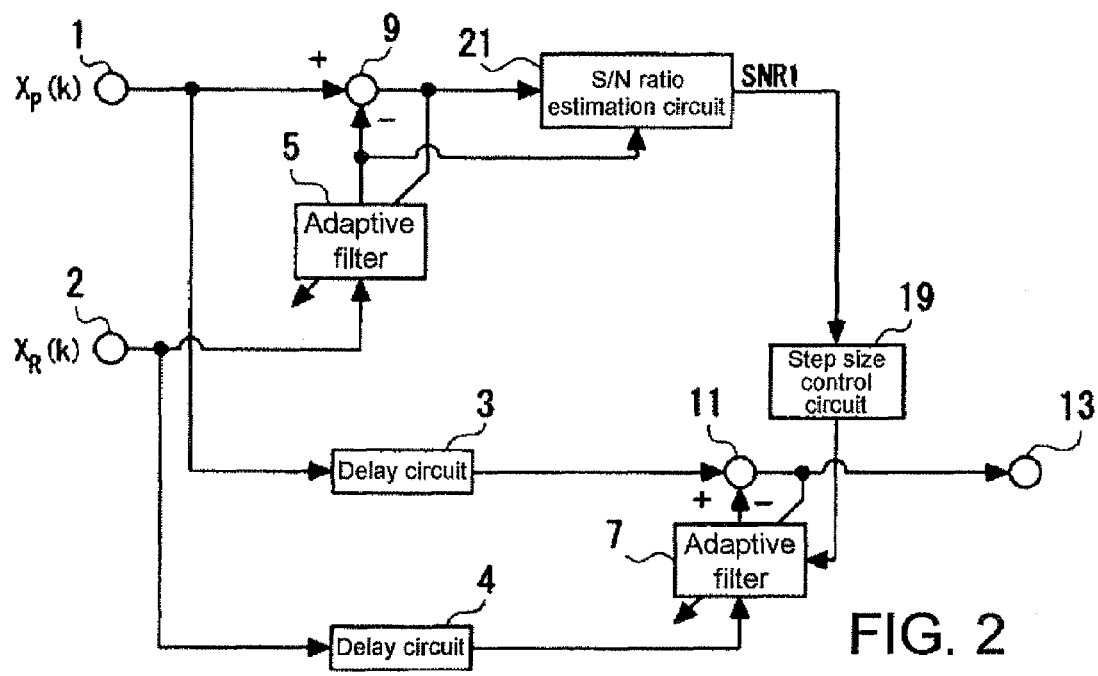
FIG. 2 is a block diagram showing another example of the configuration of a signal processor of the prior art.
Figure 3:
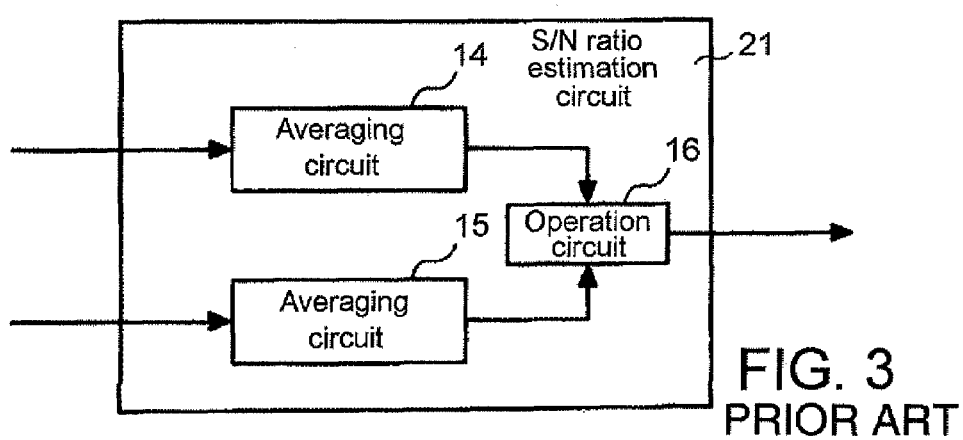
FIG. 3 is a block diagram showing the configuration of an S/N ratio estimation circuit which is used in the signal processor shown in FIG. 2.

In the above-described signal processor, the S/N ratio estimation circuit that was described using FIG. 3 can be used as S/N ratio estimation circuits 21 to 23. Accordingly, signal-to-noise ratios are used as the signal-to-noise relations in the above-described signal processor.

Figure 4:
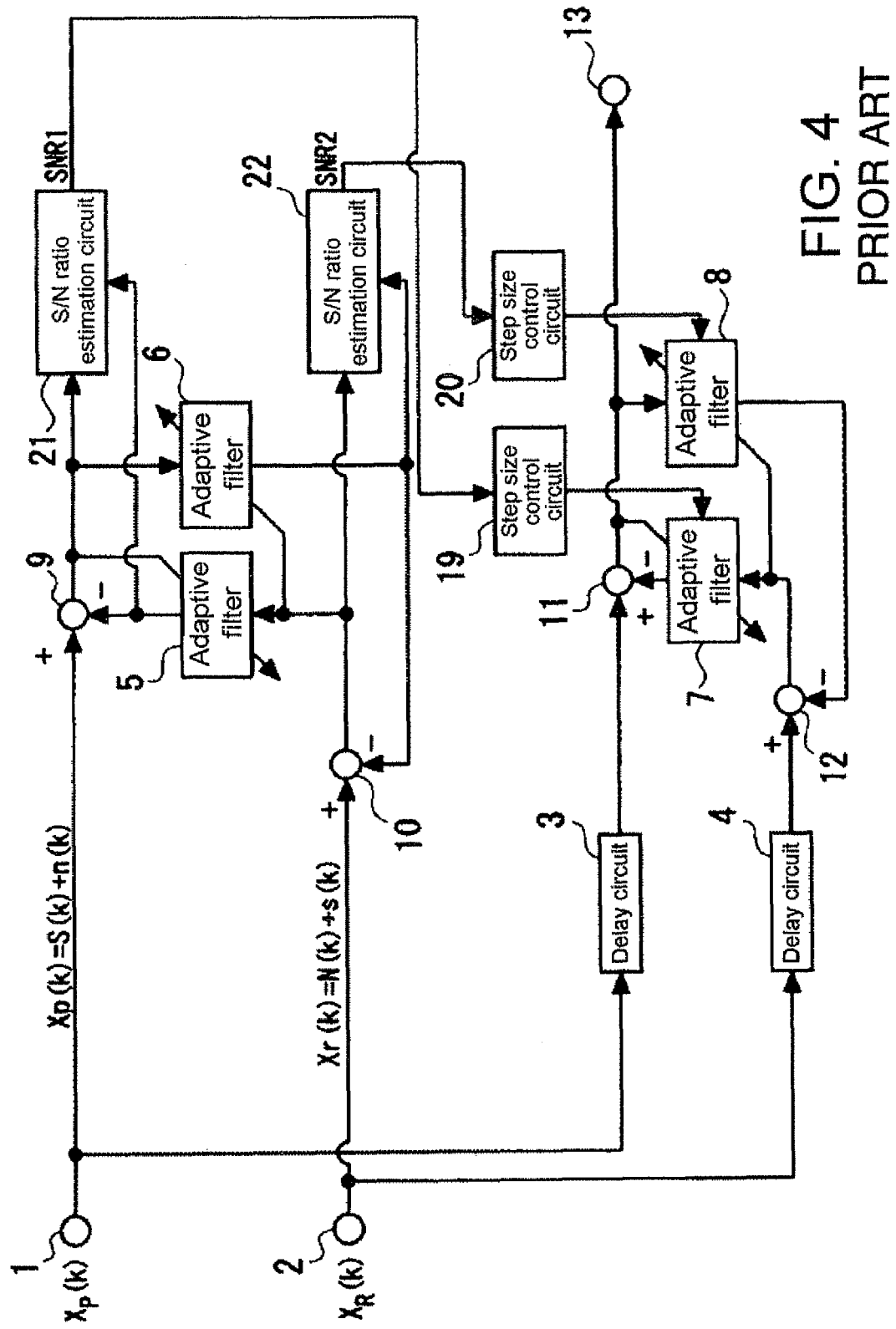
FIG. 4 is a block diagram showing yet another example of the configuration of a signal processor of the prior art.

As can be seen from a comparison of FIG. 4 and FIG. 5, the signal processor shown in FIG. 5 is of a configuration in which third S/N ratio estimation circuit 23, third step size control circuit 17, and fourth step size control circuit 18 have been added to the signal processor of the prior art shown in FIG. 4. In FIG. 5, elements that are identical or equivalent to elements shown in FIG. 4 are given the same reference numerals. To avoid redundancy in the following description, explanation regarding elements that are identical to elements in FIG. 4 is omitted, and the explanation of the signal processor shown in FIG. 5 therefore focuses on S/N ratio estimation circuit 23, step size control circuit 17, and step size control circuit 18.

S/N ratio estimation circuit 23, which is supplied with a first received sound signal which is applied as input to speech input terminal 1 and a second received sound signal which is applied as input to reference input terminal 2, takes the first received sound signal as the estimated value of the speech signal component and the second received sound signal as the estimated value of the noise signal component to find the estimated value of the signal-to-noise ratio, and supplies this value as the third signal-to-noise ratio, which is the third signal-to-noise relation. The third signal-to-noise ratio that has been found in S/N ratio estimation circuit 23 is supplied to step size control circuit 17 and step size control circuit 18, and the step sizes thus obtained are supplied to adaptive filter 5 and adaptive filter 6, respectively.

Step size control circuit 17 supplies step size $\alpha_3(k)$ that has been calculated based on the third signal-to-noise ratio found in S/N ratio estimation circuit 23 to adaptive filter 5. If the estimated value of the third signal-to-noise ratio at time k is assumed to be SNR3(k), step size control circuit 17 takes SNR3(k) as input and calculates step size $\alpha_3(k)$.

$\alpha_3(k)$ is found as a value of function $f_3(x)$ that implements monotone decrease at $SNR3_{min} < SNR3(k) < SNR3_{max}$. Here, $SNR3_{min}$, $SNR3_{max}$ are constants that satisfy the relation $SNR3_{min} < SNR3_{max}$. This relation can be represented by Equations (13a) to (13c):

$\alpha_3(k) = \alpha_{3max}$ $(SNR3(k) < SNR3_{min})$            (13a)

$\alpha_3(k) = f_3(SNR3(k))$ $(SNR3_{min} \leq SNR3(k) \leq SNR3_{max})$            (13b)

$\alpha_3(k) = \alpha_{3min}$ $(SNR3(k) > SNR3_{max})$            (13c)

Here, $\alpha_{3min}$ and $\alpha_{3max}$ are constants satisfying the relation $\alpha_{3min} < \alpha_{3max}$.

Monotone decrease function $f_3(x)$ can be determined similar to $f_1(x)$ using $\alpha_{3max}$, $\alpha_{3min}$, $SNR3_{max}$, and $SNR3_{min}$ in place of $\alpha_{1max}$, $\alpha_{1min}$, $SNR1_{max}$, and $SNR1_{min}$ in Equations (9a) to (9c).

Step size control circuit 18 supplies adaptive filter 6 step size $\alpha_4(k)$ which is calculated based on the third signal-to-noise ratio SNR3(k) found in S/N ratio estimation circuit 23.

$\alpha_4(k)$ is found as the value of function $f_4(x)$ that implements monotone increase at $SNR4_{min} < SNR4(k) < SNR4_{max}$. Here, $SNR4_{min}$ and $SNR4_{max}$ are constants satisfying the relation $SNR4_{min} < SNR4_{max}$. This relation can be represented by Equations (14a) to (14c):

$$\alpha_4(k) = \alpha_{4min}$$

$$(SNR3(k) < SNR4_{min}) \quad (14a)$$

$$\alpha_4(k) = f_4(SNR3(k))$$

$$(SNR4_{min} \leq SNR3(k) \leq SNR4_{max}) \quad (14b)$$

$$\alpha_4(k) = \alpha_{4max}$$

$$(SNR3(k) > SNR4_{max}) \quad (14c)$$

Here, $\alpha_{4min}$ and $\alpha_{4max}$ are constants that satisfy the relation $\alpha_{4min} < \alpha_{4max}$.

Monotone increase function $f_4(x)$ can be determined similar to $f_2(x)$ using $\alpha_{4max}$, $\alpha_{4min}$, $SNR4_{max}$, and $SNR4_{min}$ in place of using $\alpha_{2max}$, $\alpha_{2min}$, $SNR2_{max}$, and $SNR2_{min}$ in Equations (12a) to (12c).

Explanation next regards the principles of operation of the signal processor, i.e., the noise canceller, which is shown in FIG. 5.

This signal processor is provided with: first adaptive filter 7 that, for the purpose of eliminating the noise signal mixed in the first received sound signal which is received as input from speech input terminal 1, estimates the noise signal contained in the first received sound signal; second adaptive filter 8 that, for the purpose of eliminating the speech signal mixed in the second received sound signal which is received as input at reference input terminal 2, estimates the speech signal contained in the second received sound signal; third adaptive filter 5 that, for estimating the signal-to-noise relation (i.e., the signal-to-noise ratio) between the first received sound signal and the second received sound signal, estimates the noise signal contained in the first received sound signal which is received as input from speech input terminal 1; and fourth adaptive filter 6 that estimates the speech signal contained in the second received sound signal which is received as input at reference input terminal 2. When first step size control circuit 19, based on the signal-to-noise relation in the first received sound signal, determines that the noise signal is greater than the speech signal in the first received sound signal, first step size control circuit 19 supplies a large step size to first adaptive filter 7 to accelerate convergence. On the other hand, when it determines that the noise signal is less than the speech signal in the first received sound signal, first step size control circuit 19 supplies a small step size to first adaptive filter 7 to prevent the progression to an incorrect convergence. Similarly, when second step size control circuit 20 determines that the speech signal is greater than the noise signal in the second received sound signal based on the signal-to-noise relation in the second received sound signal, second step size control circuit 20 supplies a larger step size to second adaptive filter 8 and accelerates convergence. Conversely, when second step size control circuit 20 determines that the speech signal is smaller than the noise signal, second step size control circuit 20 supplies a smaller step size to second adaptive filter 8 and thus prevents progression to an incorrect convergence.

When third step size control circuit 17 determines that the noise signal is greater than the speech signal in the first received sound signal based on the signal-to-noise relation in the first received sound signal, third step size control circuit 17 supplies a larger step size to third adaptive filter 5 and thus accelerates convergence. On the other hand, when third step size control circuit 17 determines that the noise signal is smaller than the speech signal in the first received sound signal, third step size control circuit 17 supplies a small step size to third adaptive filter 5 and thus prevents a progression toward an incorrect convergence. Similarly, when fourth step size control circuit 18 determines that the speech signal is greater than the noise signal in the second received sound signal based on the signal-to-noise relation in the second received sound signal, fourth step size control circuit 18 supplies a large step size to fourth adaptive filter 6 and thus accelerates convergence. On the other hand, when fourth step size control circuit 18 determines that the speech signal is less than the noise signal, fourth step size control circuit 18 supplies a small step size to fourth adaptive filter 6 and thus prevents progression to an incorrect convergence.

As described in the foregoing explanation, the signal processor according to the first embodiment of the present invention uses a signal-to-noise ratio which is estimated using signals which are applied as input to speech input terminal 1 and reference input terminal 2 to estimate the size of the signal that will cause a disturbance for the operation of updating the coefficient of adaptive filter 5; and accordingly makes the step size of adaptive filter 5 a small step size when the signal-to-noise ratio is large and thus reduces the influence of the disturbance signal upon the operation of updating the coefficient, and for the opposite state, sets a large step size to shorten the convergence time of the operation of updating the coefficient. Similarly, this signal processor implements control such that the step size of adaptive filter 6 is set to a large step size when the signal-to-noise ratio is large and to a small step size in the opposite state. Accordingly, the convergence time is shortened without regard to the values of the signal-to-noise ratios at speech input terminal 1 and reference input terminal 2, and further, distortion in the output signals of subtractors 9, 10 is reduced. This effect is connected to the improvement of the accuracy of the estimated values of the speech component and noise component that are supplied to S/N ratio estimation circuits 21, 22 and achieves shortening of the convergence times of adaptive filters 7, 8 or the reduction of distortion in the output speech supplied to output terminal 13. In other words, a signal processor is obtained that can be used as a noise canceller which has short convergence time of adaptive filters 7, 8 and output speech with little distortion for an input signal in which the signal-to-noise ratio that varies over a broad range at speech input terminal 1 and reference input terminal 2.

More specifically, the procedure in the above-described first embodiment includes the steps of:

(a1) giving predetermined delay times to received sound signals to generate first and second delayed received sound signals;

(a2) subtracting a first pseudo noise signal from the first delayed received sound signal to generate a first error signal;

(a3) subtracting the first pseudo speech signal from the second delayed received sound signal to generate a second error signal;

(a4) applying the second error signal to the first adaptive filter 7 as input to generate the first pseudo noise signal;

(a5) updating the coefficient of first adaptive filter 7 such that the first error signal is minimized;

(a6) applying the first error signal to second adaptive filter 8 to generate the first pseudo speech signal;

(a7) updating the coefficient of second adaptive filter 8 such that the second error signal is minimized;

(a8) supplying the first error signal to the output terminal as a speech signal from which noise has been cancelled;

(a9) subtracting a second pseudo noise signal from the first received sound signal to generate a third error signal;

(a10) subtracting the second pseudo noise signal from the second received sound signal to generate a fourth error signal;

(a11) applying the fourth error signal to third adaptive filter 5 of the same configuration as the first adaptive filter to generate the second pseudo noise signal; (a12) updating the coefficient of third adaptive filter 5 such that the third error signal is minimized;

(a13) applying the third error signal as input to fourth adaptive filter 6 of the same configuration as the second adaptive filter to generate the second pseudo speech signal;

(a14) updating the coefficient of fourth adaptive filter 6 such that the fourth error signal is minimized;

(a15) generating a first signal-to-noise relation based on the third error signal and the second pseudo noise signal;

(a16) generating a second signal-to-noise relation based on the second pseudo speech signal and the fourth error signal;

(a17) generating a third signal-to-noise relation based on the first received sound signal and the second received sound signal;

(a18) supplying a step size for determining the amount of correction of the filter coefficient of first adaptive filter 7 based on the first signal-to-noise relation;

(a19) supplying a step size for determining the amount of correction of the filter coefficient of second adaptive filter 8 based on the second signal-to-noise relation; and (a20) supplying a step size for determining the amount of correction of the filter coefficients of third and fourth adaptive filters 5, 6 based on the third signal-to-noise relation.

Figure 6:
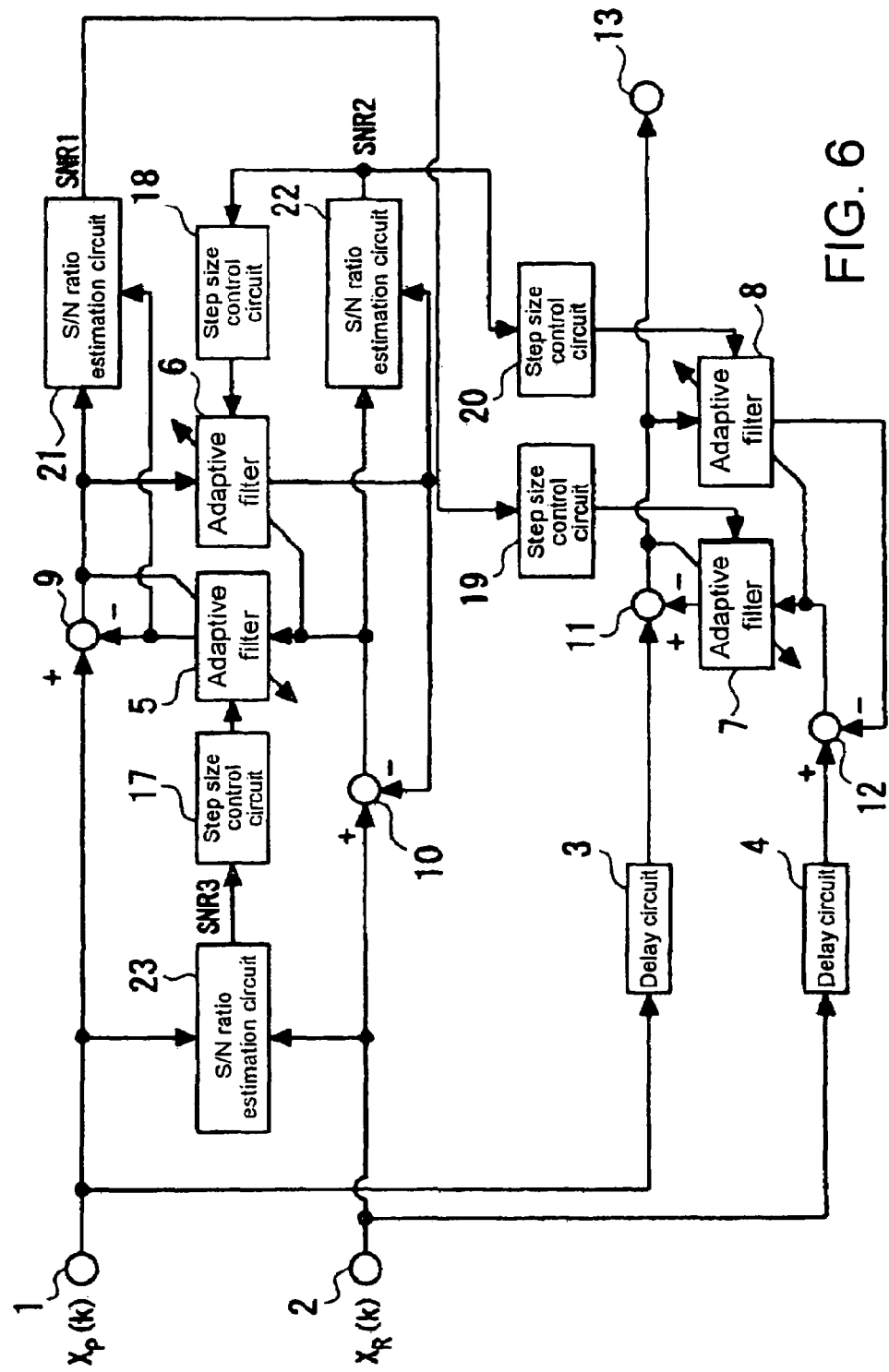
FIG. 6 is a block diagram showing the configuration of the signal processor according to the second embodiment of the present invention.

Explanation next regards the second embodiment of the present invention. In FIG. 6 which shows the signal processor of the second embodiment of the present invention, elements that are identical or equivalent to the elements shown in FIG. 5 are given the same reference numerals.

The signal processor of the second embodiment that is shown in FIG. 6 is provided with: speech input terminal 1; reference input terminal 2; output terminal 13; first delay circuit 3 for receiving first received sound signal $X_P(k)$ as input from speech input terminal 1 and giving a predetermined delay time to the first received sound signal to generate a first delayed received sound signal; second delay circuit 4 for receiving second received sound signal $X_R(k)$ as input from reference input terminal 2 and giving a delay time that is the same as that of first delay circuit 3 to second received sound signal to generate second delayed received sound signal; first subtractor 11 for subtracting a first pseudo noise signal from the first delayed received sound signal to generate a first error signal; second subtractor 12 for subtracting the first pseudo speech signal from the second delayed received sound signal to generate a second error signal; first adaptive filter 7 for receiving the second error signal as input from second subtractor 12 to generate the first pseudo noise signal and updating the coefficient such that the first error signal is minimized; and second adaptive filter 8 for receiving the first error signal as input from first subtractor 11 to generate the first pseudo speech signal and updating the coefficient such that the second error signal is minimized; wherein the first error signal is also supplied to output terminal 13 as a speech signal from which noise has been cancelled.

This signal processor further includes: third subtractor 9 for subtracting a second pseudo noise signal from the first received sound signal to generate a third error signal; a fourth subtractor 10 for subtracting the second pseudo speech signal from the second received sound signal to generate a fourth error signal; third adaptive filter 5 for receiving the fourth error signal as input to generate the second pseudo noise signal and update the coefficient such that the third error signal is minimized; fourth adaptive filter 6 for receiving the third error signal as input to generate the second pseudo speech signal and updating the coefficient such that the fourth error signal is minimized; first S/N ratio estimation circuit 21 for generating a first signal-to-noise relation based on the third error signal and the second pseudo noise signal; second S/N ratio estimation circuit 22 for generating a second signal-to-noise relation based on the second pseudo speech signal and the fourth error signal; third S/N ratio estimation circuit 23 for generating a third signal-to-noise relation based on the first received sound signal and the second received sound signal; first step size control circuit 19 for supplying a step size for determining the amount of correction of the filter coefficient of the first adaptive filter based on the first signal-to-noise relation; second step size control circuit 20 for supplying a step size for determining the amount of correction of the filter coefficient of the second adaptive filter based on the second signal-to-noise relation; third step size control circuit 17 for supplying a step size for determining the amount of correction of the filter coefficient of the third adaptive filter based on the third signal-to-noise relation; and fourth step size control circuit 18 for supplying a step size for determining the amount of correction of the filter coefficient of fourth adaptive filter 6 based on the second signal-to-noise relation.

In other words, the signal processor of the second embodiment shown in FIG. 6 differs from the signal processor of the first embodiment shown in FIG. 5 with respect to step size control circuit 18, the other elements being of the same configuration. The following explanation therefore regards step size control circuit 18.

The input signal to step size control circuit 18 is not the third signal-to-noise ratio from third S/N ratio estimation circuit 23, but rather, the second signal-to-noise ratio which is found by second S/N ratio estimation circuit 22. Step size control circuit 18 supplies step size $\alpha_4(k)$ calculated based on second signal-to-noise ratio $SNR2(k)$ to fourth adaptive filter 6.

$\alpha_4(k)$ can be similarly determined by using $SNR2(k)$, $SNR5_{max}$, $SNR5_{min}$, $\alpha_{5max}$, and $\alpha_{5min}$ in place of $SNR3(k)$, $SNR4_{max}$, $SNR4_{min}$, $\alpha_{4max}$, and $\alpha_{4min}$ of Equations (14a) to (14c). Here, $SNR5_{min}$ and $SNR5_{max}$ are constants satisfying the relation $SNR5_{min} < SNR5_{max}$, and $\alpha_{5min}$ and $\alpha_{5max}$ are constants satisfying the relation $\alpha_{5min} < \alpha_{5max}$. Thus, by using the second signal-to-noise ratio found in S/N ratio estimation circuit 22 in place of the third signal-to-noise ratio found in S/N ratio estimation circuit 23, the signal processor shown in FIG. 6 can operate similarly to the signal processor of the first embodiment.

Similarly, the signal processor of the present embodiment may also be of a configuration in which the input signal of step size control circuit 18 is set to the signal-to-noise ratio found in S/N ratio estimation circuit 23 and the input signal of step size control circuit 17 is set to the signal-to-noise ratio found in S/N ratio estimation circuit 21. This possibility is obvious from the symmetry of the circuit configuration.

The principles of operation of the signal processor of the second embodiment that is shown in FIG. 6 are similar to those of the above-described signal processor of the first embodiment. More specifically, the procedure in the second embodiment includes the steps (a1) to (a19) of the first embodiment, and is further provided with the steps of:

(a20a) supplying a step size for determining the amount of correction of the filter coefficient of third adaptive filter 5 based on the third signal-to-noise relation; and (a21a) supplying a step size for determining the amount of correction of the filter coefficient of fourth adaptive filter 6 based on the second signal-to-noise relation.

Figure 7:
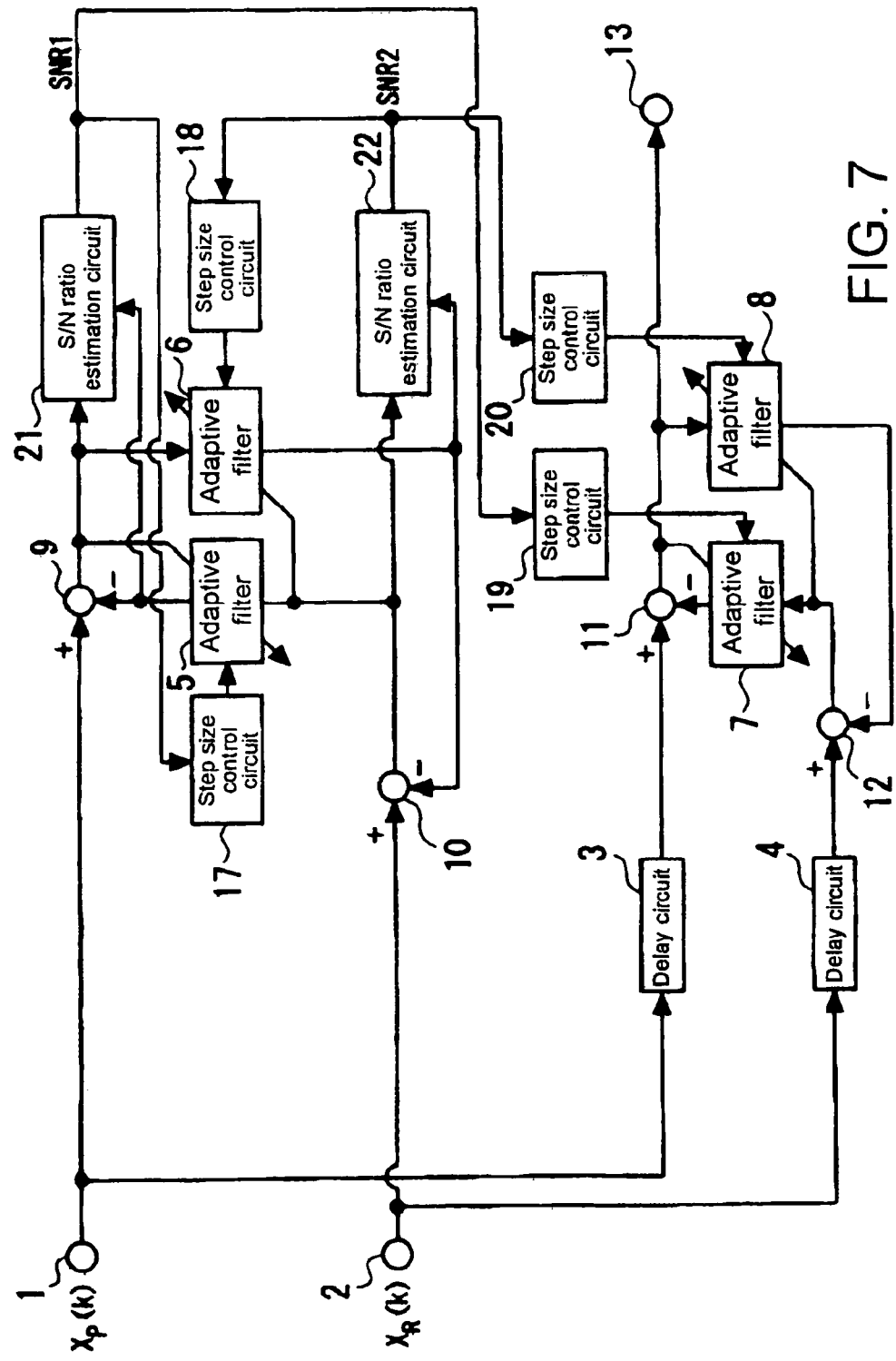
FIG. 7 is a block diagram showing the configuration of the signal processor according the third embodiment of the present invention.

Explanation next regards the third embodiment of the present invention. In FIG. 7 that shows the signal processor of the third embodiment of the present invention, elements that are identical or equivalent to elements shown in FIG. 6 are given the same reference numerals.

The signal processor of the third embodiment that is shown in FIG. 7 is provided with: speech input terminal 1; reference input terminal 2; output terminal 13; first delay circuit 3 for receiving first received sound signal $X_P(k)$ as input from speech input terminal 1 and giving a predetermined delay time to the first received sound signal to generate a first delayed received sound signal; second delay circuit 4 for receiving second received sound signal $X_R(k)$ which is received from reference input terminal 2 and giving the second received sound signal the same delay time as first delay circuit 3 to generate a second delayed received sound signal; first subtractor 11 for subtracting a first pseudo noise signal from the first delayed received sound signal to generate a first error signal; second subtractor 12 for subtracting the first pseudo speech signal from the second delayed received sound signal to generate a second error signal; first adaptive filter 7 for receiving the second error signal as input from second subtractor 12 to generate the first pseudo noise signal and update the coefficient such that the first error signal is minimized; and second adaptive filter 8 for receiving the first error signal as input from first subtractor 11 to generate the first pseudo speech signal and update the coefficient such that the second error signal is minimized; wherein the first error signal is also supplied to output terminal 13 as a speech signal from which noise has been cancelled.

This signal processor further includes: third subtractor 9 for subtracting a second pseudo noise signal from the first received sound signal to generate a third error signal; fourth subtractor 10 for subtracting the second pseudo speech signal from the second received sound signal to generate a fourth error signal; third adaptive filter 5 for receiving the fourth error signal to generate the second pseudo noise signal and update the coefficient such that the third error signal is minimized; fourth adaptive filter 6 for receiving the third error signal to generate the second pseudo speech signal and update the coefficient such that the fourth error signal is minimized; first S/N ratio estimation circuit 21 for generating a first signal-to-noise relation based on the third error signal and the second pseudo noise signal; second S/N ratio estimation circuit 22 for generating a second signal-to-noise relation based on the second pseudo speech signal and the fourth error signal; first step size control circuit 19 for supplying a step size for determining the amount of correction of the filter coefficient of the first adaptive filter based on the first signal-to-noise relation: second step size control circuit 20 for supplying a step size for determining the amount of correction of the filter coefficient of the second adaptive filter based on the second signal-to-noise relation; third step size control circuit 17 for supplying a step size for determining the amount of correction of the filter coefficient of the third adaptive filter based on the first signal-to-noise relation; and fourth step size control circuit 18 for supplying a step size for determining the amount of correction of the filter coefficient of the fourth adaptive filter based on the second signal-to-noise relation.

In other words, the signal processor of the third embodiment shown in FIG. 7 is of a configuration in which third S/N ratio estimation circuit 23 is removed from the signal processor of the second embodiment shown in FIG. 6, and moreover, in which step size control circuit 17 differs from that of the device of FIG. 6. The configuration is otherwise equivalent to that of the device shown in FIG. 6, and the operation of the elements in the signal processor of the third embodiment shown in FIG. 7 is similar to that of the device shown in FIG. 6 with the exception of step size control circuit 17, and the following explanation therefore regards only step size control circuit 17.

The input signal of step size control circuit 17 is the first signal-to-noise ratio found in first S/N ratio estimation circuit 21. Step size control circuit 17 supplies step size $\alpha_3(k)$ calculated based on this signal-to-noise ratio SNR1(k) to adaptive filter 5.

$\alpha_3(k)$ can be similarly determined by using SNR1(k), $SNR6_{max}$, $SNR6_{min}$, $\alpha_{6max}$, and $\alpha_{6min}$ in place of SNR3(k), $SNR3_{max}$, $SNR3_{min}$, $\alpha_{3max}$, and $\alpha_{3min}$ of Equations (13a) to (13c).

Here, $SNR6_{min}$ and $SNR6_{max}$ are constants satisfying the relation $SNR6_{min} < SNR6_{max}$, and $\alpha_{6min}$ and $\alpha_{6max}$ are constants satisfying the relation $\alpha_{6min} < \alpha_{5max}$.

Thus, using the first signal-to-noise ratio found in first S/N ratio estimation circuit 21 instead of providing the third S/N ratio estimation circuit and using the third signal-to-noise ratio eliminates the need for providing the third S/N ratio estimation circuit and the amount of operations that correspond to this third S/N ratio estimation circuit can be eliminated.

The principles of operation of the signal processor of the third embodiment shown in FIG. 7 are similar to those of the signal processor of the above-described first embodiment. More specifically, the procedure in the third embodiment includes the steps (a1) to (a16) of the first embodiment, and further includes the steps of:

(a17b) supplying a step size for determining the amount of correction of the filter coefficient of first adaptive filter 7 based on the first signal-to-noise relation;

(a18b) supplying a step size for determining the amount of correction of the filter coefficient of second adaptive filter 8 based on the second signal-to-noise relation;

(a19b), supplying a step size for determining the amount of correction of the filter coefficient of third adaptive filter 5 based on the first signal-to-noise relation; and (a20b) supplying a step size for determining the amount of correction of the filter coefficient of fourth adaptive filter 6 based on the second signal-to-noise relation.

Figure 8:
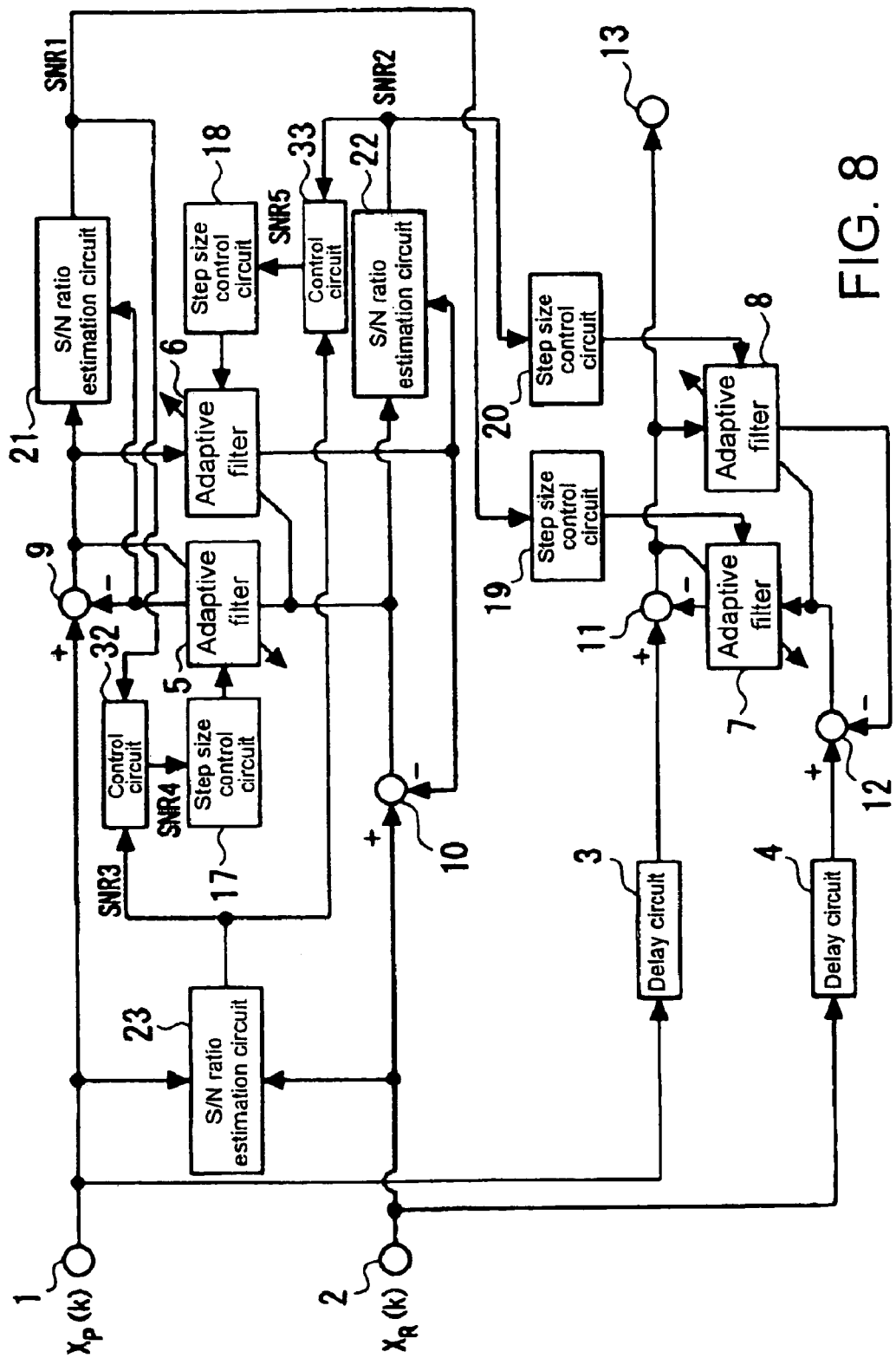
FIG. 8 is a block diagram showing the configuration of the signal processor according to the fourth embodiment of the present invention.

Explanation next regards the fourth embodiment of the present invention. In FIG. 8 showing the signal processor of the fourth embodiment of the present invention, elements that are identical or equivalent to elements shown in FIG. 5 are given the same reference numerals.

The signal processor of the fourth embodiment shown in FIG. 8 is provided with: speech input terminal 1; reference input terminal 2; output terminal 13; first delay circuit 3 for receiving first received sound signal $X_P(k)$ as input from speech input terminal 1 and conferring a predetermined delay time to the first received sound signal to generate a first delayed received sound signal; second delay circuit 4 for receiving second received sound signal $X_R(k)$ as input from reference input terminal 2 and conferring the same delay time as that of first delay circuit 3 to the second received sound signal to generate a second delayed received sound signal; first subtractor 11 for subtracting a first pseudo noise signal from the first delayed received sound signal to generate a first error signal; a second subtractor 12 for subtracting the first pseudo speech signal from the second delayed received sound signal to generate a second error signal; a first adaptive filter 7 for receiving as input the second error signal from second subtractor 12 to generate the first pseudo noise signal and update the coefficient such that the first error signal is minimized; and second adaptive filter 8 for receiving as input the first error signal from first subtractor 11 to generate the first pseudo speech signal and update the coefficient such that the second error signal is minimized; wherein the first error signal is further supplied to output terminal 13 as a speech signal from which noise has been cancelled.

The signal processor further includes: third subtractor 9 for subtracting a second pseudo noise signal from the first received sound signal to generate a third error signal; fourth subtractor 10 for subtracting the second pseudo speech signal from the second received sound signal to generate a fourth error signal; third adaptive filter 5 for receiving as input the fourth error signal to generate the second pseudo noise signal and update the coefficient such that the third error signal is minimized; fourth adaptive filter 7 for receiving as input the third error signal to generate the second pseudo speech signal and update a coefficient such that the fourth error signal is minimized; first S/N ratio estimation circuit 21 for generating a first signal-to-noise relation based on the third error signal and the second pseudo noise signal; second S/N ratio estimation circuit 22 for generating second signal-to-noise relation based on the second pseudo speech signal and the fourth error signal; third S/N ratio estimation circuit 23 for generating a third signal-to-noise relation based on the first received sound signal and the second received sound signal; first control circuit 32 for receiving as input the relation of the first signal-to-noise relation and the third signal-to-noise relation, and depending on whether the relation of these signal-to-noise relations is within a predetermined range or not, selecting one signal-to-noise relation and supplying the selected signal-to-noise relation as the fourth signal-to-noise relation; second control circuit 33 for receiving the relation of the second signal-to-noise relation and the third signal-to-noise relation, and depending on whether the relation of these signal-to-noise relations is within a predetermined range, selecting one signal-to-noise relation and supplying the selected signal-to-noise relation as the fifth signal-to-noise relation; first step size control circuit 19 for supplying a step size for determining the amount of correction of the filter coefficient of first adaptive filter 7 based on the first signal-to-noise relation; second step size control circuit 20 for supplying a step size for determining the amount of correction of the filter coefficient of second adaptive filter 8 based on the second signal-to-noise relation; third step size control circuit 17 for supplying a step size for determining the amount of correction of the filter coefficient of third adaptive filter 5 based on the fourth signal-to-noise relation; and fourth step size control circuit 18 for supplying a step size for determining the amount of correction of the filter coefficient of fourth adaptive filter 6 based on the fifth signal-to-noise relation.

In other words, the signal processor of the fourth embodiment shown in FIG. 8 is a device realized by adding control circuits 32, 33 to the signal processor shown in FIG. 5, wherein signal-to-noise ratios are applied as input to step size control circuits 17, 18 by way of control circuit 32, 33, respectively. In the signal processor shown in FIG. 8, the operation of elements other than step size control circuits 17, 18 is similar to the operation of the device shown in FIG. 5, and the following explanation therefore regards control circuits 32, 33 and step size control circuits 17, 18.

Control circuit 32 is supplied with the third signal-to-noise ratio found in third S/N ratio estimation circuit 23 and the first signal-to-noise ratio found in first S/N ratio estimation circuit 21. Control circuit 32 then selects one of signal-to-noise ratios SNR3(k) and SNR1(k) that are supplied from S/N ratio estimation circuits 23, 21, takes this signal-to-noise ratio as fourth signal-to-noise ratio SNR4(k), and supplies this signal-to-noise ratio to step size control circuit 17. This relation can be represented by Equations (15a), (15b), and (16):

$$SNR4(k) = SNR1(k) \ (r_1(k) \geq r_{1th}) \tag{15a}$$

$$SNR4(k) = SNR3(k) \ (r_1(k) < r_{1th}) \tag{15b}$$

$$r_1(k) = SNR3(k)/SNR1(k) \tag{16}$$

where $r_{1th}$ is a positive constant.

Equations (17a) and (17b) may also be used in place of Equations (15a) and (15b).

$$SNR4(k) = SNR3(k) \ (R_1(k) \geq R_{1th}) \tag{17a}$$

$$SNR4(k) = SNR1(k) \ (R_1(k) < R_{1th}) \tag{17b}$$

where $R_{1th}$ is a positive constant, $R_1(k)$ is the mean of the change of $r_1(k)$ from time $k-m+1$ to $k$ that is given by Equation (18):

$$R_1(k) = \left(\frac{1}{m}\right) \sum_{i=0}^{m-1} \{|r_1(k-i) - r_1(k-i-1)|\} \tag{18}$$

In contrast with the device shown in FIG. 5, the input signal of step size control circuit 17 is fourth signal-to-noise ratio SNR4(k) found by control circuit 32. Step size control circuit 17 supplies step size $\alpha_3(k)$ calculated based on this fourth signal-to-noise ratio SNR4(k) to adaptive filter 5.

$\alpha_3(k)$ can be similarly determined using SNR4(k), $SNR7_{max}$, $SNR7_{min}$, $\alpha_{7max}$, and $\alpha_{7min}$ in place of SNR3(k), $SNR3_{max}$, $SNR3_{min}$, $\alpha_{3max}$, and $\alpha_{3min}$ of Equations (13a) to (13c). In this case, $SNR7_{min}$ and $SNR7_{max}$, are constants satisfying the relation $SNR7_{min} < SNR7_{max}$, and $\alpha_{7min}$ and $\alpha_{7max}$ are constants satisfying the relation $\alpha_{7min} < \alpha_{7max}$.

Control circuit 33 is supplied with the third signal-to-noise ratio found in third S/N ratio estimation circuit 23 and second signal-to-noise ratio found in second S/N ratio estimation circuit 22. Control circuit 33 selects one of signal-to-noise ratios SNR3(k) and SNR2(k) which are supplied from S/N ratio estimation circuits 23, 22, takes the selected signal-to-noise ratio as fifth signal-to-noise ratio SNR5(k), and supplies this fifth signal-to-noise ratio SNR5(k) to step size control circuit 18. This relation can be represented by Equations (19a), (19b), and (20):

$$SNR5(k) = SNR2(k) \ (r_2(k) \geq r_{2th}) \tag{19a}$$

$$SNR5(k) = SNR3(k) \ (r_2(k) < r_{2th}) \tag{19b}$$

$$r_2(k) = SNR3(k)/SNR2(k) \tag{20}$$

where $r_{2th}$ is a positive constant. Equations (21a) and (21b) may also be used in place of Equations (19a) and (19b).

$$SNR5(k) = SNR3(k) \ (R_2(k) \geq R_{2th}) \tag{21a}$$

$$SNR5(k) = SNR2(k) \ (R_2(k) < R_{2th}) \tag{21b}$$

where $R_{2th}$ is a positive constant, $R_2(k)$ is the mean of the change of $r_2(k)$ from time k−m+1 to k that is given by Equation (22):

$$R_2(k) = \left(\frac{1}{m}\right)\sum_{i=0}^{m-1}\{|r_2(k-i) - r_2(k-i-1)|\} \quad (22)$$

In contrast with the device shown in FIG. 5, the input signal of step size control circuit 18 is fifth signal-to-noise ratio SNR5(k) found by control circuit 33. Step size control circuit 18 supplies step size $\alpha_4(k)$ calculated based on this signal-to-noise ratio SNR5(k) to adaptive filter 6.

$\alpha_4(k)$ can be similarly determined using SNR5(k), $SNR8_{max}$, $SNR8_{min}$, $\alpha_{8max}$, and $\alpha_{8min}$ in place of SNR3(k), $SNR4_{max}$, $SNR4_{min}$, $\alpha_{4max}$, and $\alpha_{4min}$ of Equations (14a) to (14c). In this case, $SNR8_{min}$ and $SNR8_{max}$ are constants satisfying the relation $SNR8_{min}<SNR8_{max}$, and $\alpha_{8min}$ and $\alpha_{8max}$ are constants satisfying the relation $\alpha_{8min}<\alpha_{8max}$.

In this way, according to the present embodiment, an appropriate value is selected from the first and third signal-to-noise ratios which are found by S/N ratio estimation circuits 21, 23 and this selected value is supplied to step size control circuit 17, and similarly, an appropriate value is selected from the second and third signal-to-noise ratios which are found by S/N ratio estimation circuits 22, 23 and this value is supplied to step size control circuit 18, whereby the optimum step size can be calculated more effectively than a case in which one of the signal-to-noise ratios is supplied to step size control circuits 17, 18. This is because the estimated value in S/N ratio estimation circuit 23 is influenced by the noise signal component that leaks to input terminal 1 and the speech signal component that leaks to input terminal 2 and therefore is not sufficiently accurate.

On the other hand, S/N ratio estimation circuits 21, 22 use signals from which influences caused by these leak components are cancelled by adaptive filters 5, 6 to perform the estimation operation, and estimated values can therefore be obtained with high accuracy. However, this operation is influenced by the convergence of adaptive filters 5, 6, and the accuracy of estimated values is therefore not adequate until these adaptive filters converge. Therefore, control circuits 32, 33 select the appropriate signal-to-noise ratios and supply the signal-to-noise ratios to step size control circuits 17, 18 to enable calculation of the optimum step size.

The principles of operation of the signal processor of the fourth embodiment shown in FIG. 8 are similar to the above-described signal processor of the first embodiment. More specifically, the procedure in the fourth embodiment includes the steps (a1) to (a17) of the first embodiment, and further includes the steps of:

(a18c) depending on whether the relation of the first signal-to-noise relation and the second signal-to-noise relation is within a predetermined range, selecting one and supplying it as the fourth signal-to-noise relation;

(a19c) depending on whether the relation of the first signal-to-noise relation and second signal-to-noise relation is within a predetermined range, selecting one and supplying it as the fifth signal-to-noise relation;

(a20c) supplying a step size for determining the amount of correction of the filter coefficient of first adaptive filter 7 based on the first signal-to-noise relation;

(a21c) supplying a step size for determining the amount of correction of the filter coefficient of second adaptive filter 8 based on the second signal-to-noise relation;

(a22c) supplying a step size for determining the amount of correction of the filter coefficient of third adaptive filter 5 based on the fourth signal-to-noise relation; and (a23c) supplying a step size for determining the amount of correction of the filter coefficient of fourth adaptive filter 6 based on the fifth signal-to-noise relation.

Figure 9:
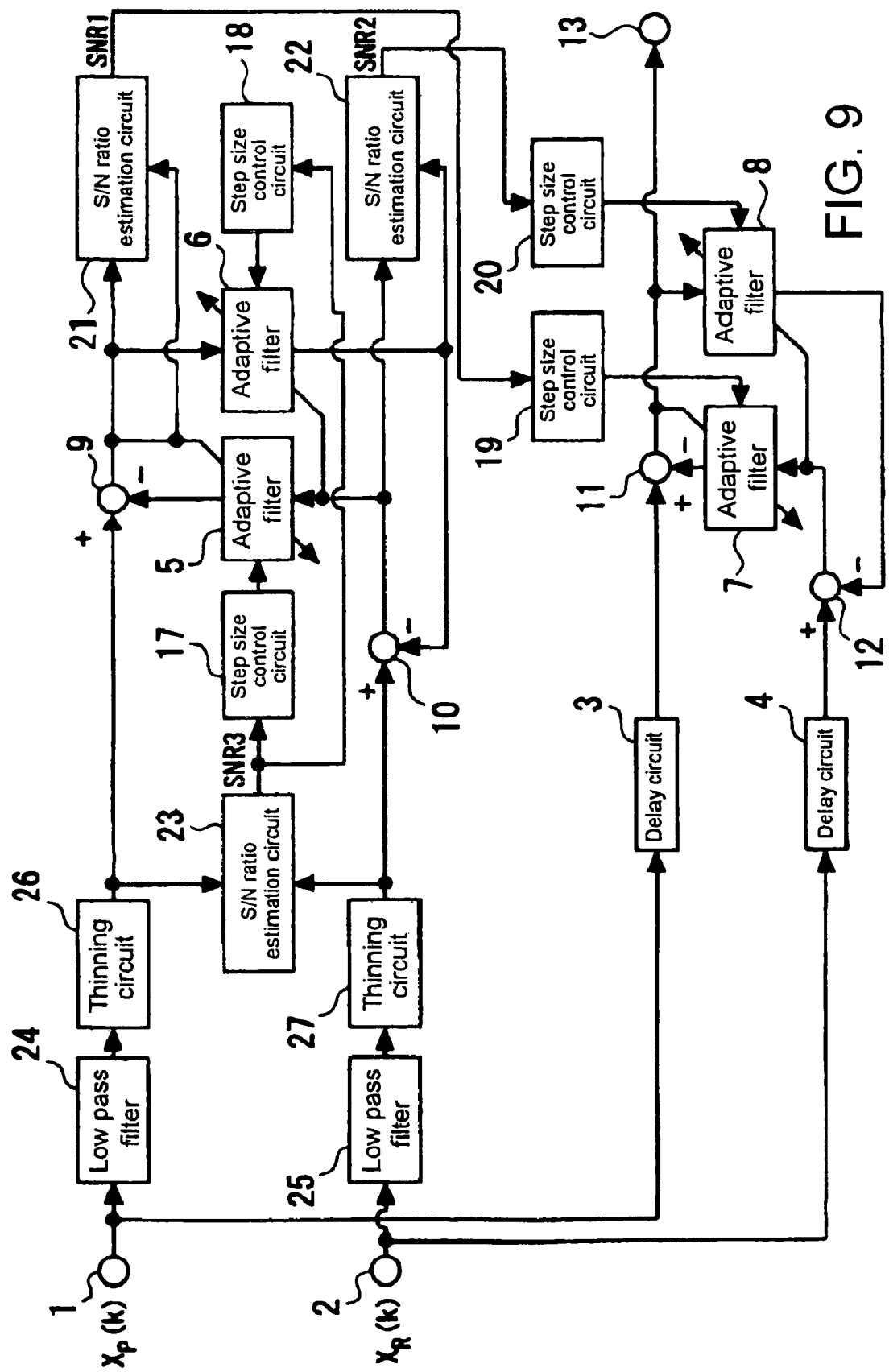
FIG. 9 is a block diagram showing the configuration of the signal processor according to the fifth embodiment of the present invention.

Explanation next regards the fifth embodiment of the present invention. In FIG. 9 that shows the signal processor of the fifth embodiment of the present invention, elements that are identical or equivalent to elements shown in FIG. 5 are given the same reference numerals.

The signal processor of the fifth embodiment shown in FIG. 9 is provided with: speech input terminal 1; reference input terminal 2; output terminal 13, fist delay circuit 3 for receiving first received sound signal $X_P(k)$ as input from speech input terminal 1 and conferring a predetermined delay time to the first received sound signal to generate a first delayed received sound signal; second delay circuit 4 for receiving second received sound signal $X_R(k)$ as input from reference input terminal 2 and conferring a delay time that is the same as that of first delay circuit 3 to the second received sound signal to generate a second delayed received sound signal; first subtractor 11 for subtracting a first pseudo noise signal from the first delayed received sound signal to generate a first error signal; second subtractor 12 for subtracting a first pseudo speech signal from the second delayed received sound signal to generate a second error signal; first adaptive filter 7 for taking the second error signal from second subtractor 12 as input to generate the first pseudo noise signal and update the coefficient such that the first error signal is minimized; and second adaptive filter 8 for taking the first error signal from first subtractor 11 as input to generate the first pseudo speech signal and update the coefficient such that the second error signal is minimized; wherein the first error signal is also supplied to output terminal 13 as a speech signal from which noise has been cancelled.

This signal processor further includes: first low-pass filter 24 for suppressing the component which exceeds a predetermined frequency in the first received sound signal and supplying the result; a second low-pass filter 25 for suppressing the component in second received sound signal which exceeds a predetermined frequency identical to that of first low-pass filter 24 and supplying the result; first thinning circuit 26 for thinning out a signal at a predetermined thinning rate from the signal supplied by first low-pass filter 24 to generate a first thinned received sound signal; second thinning circuit 27 for thinning out a signal at the same thinning rate as first thinning circuit 26 from the signal supplied from second low-pass filter 25 to generate a second thinned received sound signal; third subtractor 9 for subtracting the second pseudo noise signal from the first thinned received sound signal to generate a third error signal; fourth subtractor 10 for subtracting the second pseudo speech signal from the second thinned received sound signal to generate a fourth error signal; third adaptive filter 5 for taking the fourth error signal as input to generate the second pseudo noise signal and update the coefficient such that the third error signal is minimized; fourth adaptive filter 6 for taking the third error signal as input to generate the second pseudo speech signal and update a coefficient such that the fourth error signal is minimized; first S/N ratio estimation circuit 21 for generating a first signal-to-noise relation from the third error signal and the second pseudo noise signal; second S/N ratio estimation circuit 22 for generating a second signal-to-noise relation from the second pseudo speech signal and the fourth error signal; third S/N ratio estimation circuit 23 for generating a third signal-to-noise relation from the first thinned received sound signal and the second thinned received sound signal; first step size control circuit 19 for supplying a step size for determining the amount of correction of the filter coefficient of first adaptive filter 7 based on the first signal-to-noise relation; second step size control circuit 20 for supplying a step size for determining the amount of correction of the filter coefficient of second adaptive filter 8 based on the second signal-to-noise relation; third step size control circuit 17 for supplying a step size for determining the amount of correction of the filter coefficient of third adaptive filter 5 based on third signal-to-noise relation; and fourth step size control circuit 18 for supplying a step size for determining the amount of correction of the filter coefficient of fourth adaptive filter 6 similarly based on the third signal-to-noise relation.

Essentially, the signal processor of the fifth embodiment shown in FIG. 9 is a device in which low-pass filters 24, 25 and thinning circuits 26, 27 are added to the signal processor shown in FIG. 5. The following explanation therefore regards low-pass filters 24, 25 and thinning circuits 26, 27.

Thinning circuit 26, by thinning out a signal having a sampling frequency $f_0$ which is supplied from speech input terminal 1 by way of low-pass filter 24, converts the sampling frequency to $f_s$ and supplies the result. In other words, the thinning rate is $f_0/f_3$. To prevent aliasing distortion caused by the thinning process in thinning circuit 26, low-pass filter 24 suppresses the input signal component which is equal to or greater than frequency $f_p$ and supplies the result to thinning circuit 26. Here, $2f_p < f_s < f_0$. Thinning circuit 27 similarly thins out the signal having a sampling frequency $f_0$ which is supplied from reference input terminal 2 by way of low-pass filter 25 to convert the sampling frequency to $f_s$ and supplies the result as output. Low-pass filter 25 operates similarly to low-pass filter 24.

Thus, in the present embodiment, a signal for which the sampling frequency has been converted by thinning to $f_s$ is supplied to S/N ratio estimation circuits 21, 22, 23 and adaptive filters 5, 6, whereby the operation load of these circuits can be reduced.

The principles of operation of the signal processor of the fifth embodiment shown in FIG. 9 are similar to those of the previously described signal processor of the first embodiment. More specifically, the procedures in the sixth embodiment include the steps (a1) to (a8) of the first embodiment, and further include the steps of:

(a9d) applying first and second received sound signals as input to first and second low-pass filters 24, 25 to generate a signal in which the component that is equal to or greater than a predetermined frequency is suppressed;

(a10d) thinning a signal of a predetermined thinning rate from signals supplied from first and second low-pass filters 24, 25 to generate first and second thinned received sound signals;

(a11d) subtracting the second pseudo noise signal from the first thinned received sound signal to generate a third error signal;

(a12d) subtracting the second pseudo noise signal from the second thinned received sound signal to generate a fourth error signal;

(a13d) applying the fourth error signal to third adaptive filter 5 of the same configuration as the first adaptive filter to generate the second pseudo noise signal;

(a14d) updating the coefficient of third adaptive filter 5 such that the third error signal is minimized;

(a15d) applying the third error signal as input to fourth adaptive filter 6 of the same configuration as the second adaptive filter to generate the second pseudo speech signal;

(a16d) updating the coefficient of fourth adaptive filter 6 such that the fourth error signal is minimized;

(a17d) generating a first signal-to-noise relation from the third error signal and the second pseudo noise signal;

(a18d) generating a second signal-to-noise relation from the second pseudo speech signal and the fourth error signal;

(a19d) generating a third signal-to-noise relation from the first thinned received sound signal and the second thinned received sound signal;

(a20d) supplying a step size for determining the amount of correction of the filter coefficient of first adaptive filter 7 based on the first signal-to-noise relation;

(a21d) supplying a step size for determining the amount of correction of the filter coefficient of second adaptive filter 8 based on the second signal-to-noise relation; and (a22d) supplying a step size for determining the amount of correction of the filter coefficient of third and fourth adaptive filters 7, 8 based on the third signal-to-noise relation.

Figure 10:
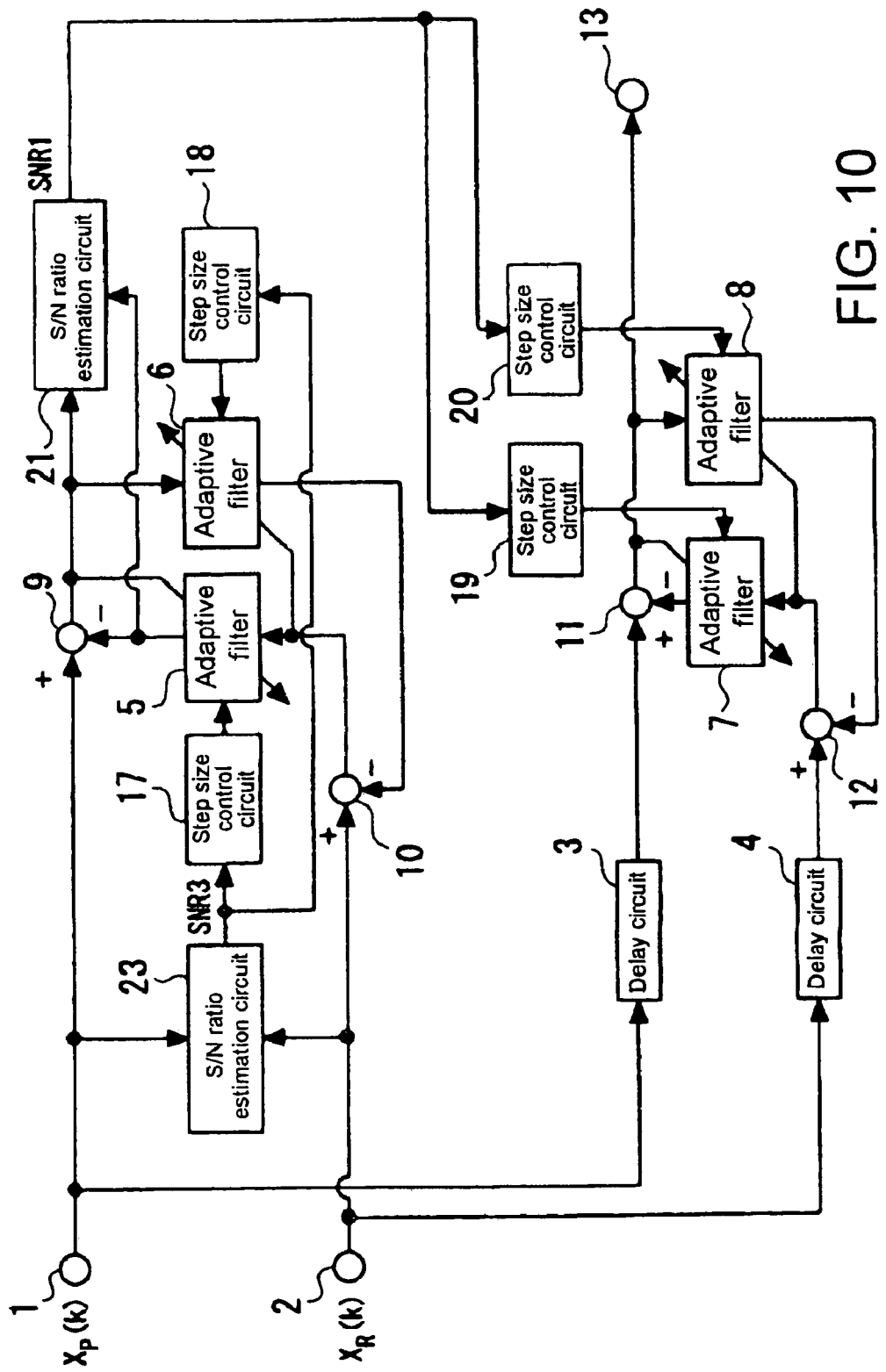
FIG. 10 is a block diagram showing the configuration of the signal processor according to the sixth embodiment of the present invention.

Explanation next regards the sixth embodiment of the present invention. In FIG. 10 that shows the signal processor of the sixth embodiment of the present invention, elements that are identical or equivalent to elements shown in FIG. 5 are given the same reference numerals.

The signal processor of the sixth embodiment shown in FIG. 10 is provided with: speech input terminal 1; reference input terminal 2; output terminal 13; first delay circuit 3 for receiving first received sound signal $X_P(k)$ as input from speech input terminal 1 and conferring a predetermined delay time to the first received sound signal to generate a first delayed received sound signal; second delay circuit 4 for receiving second received sound signal $X_R(k)$ as input from reference input terminal 2 and conferring to the second received sound signal a delay time which is the same as that of first delay circuit 3 to generate a second delayed received sound signal; first subtractor 11 for subtracting a first pseudo noise signal from the first delayed received sound signal to generate a first error signal; second subtractor 12 for subtracting the first pseudo speech signal from the second delayed received sound signal to generate a second error signal; first adaptive filter 7 for taking the second error signal from second subtractor 12 as input to generate the first pseudo noise signal and update the coefficient such that the first error signal is minimized; and second adaptive filter 8 for receiving the first error signal from the first subtractor 11 as input to generate the first pseudo speech signal and update the coefficient such that the second error signal is minimized; wherein the first error signal is further supplied to output terminal 13 as a speech signal from which noise has been cancelled.

This signal processor further includes: third subtractor 9 for subtracting the second pseudo noise signal from the first received sound signal to generate a third error signal; fourth subtractor 10 for subtracting the second pseudo speech signal from the second received sound signal to generate a fourth error signal; third adaptive filter 5 for receiving the fourth error signal as input to generate the second pseudo noise signal and update the coefficient such that the third error signal is minimized; fourth adaptive filter 6 for taking the third error signal as input to generate the second pseudo speech signal and update the coefficient such that the fourth error signal is minimized; first S/N ratio estimation circuit 21 for generating a first signal-to-noise relation from the third error signal and the second pseudo noise signal; third S/N ratio estimation circuit 23 for generating a third signal-to-noise relation from the first received sound signal and the second received sound signal; first step size control circuit 19 for supplying a step size for determining the amount of correction of the filter coefficient of first adaptive filter 7 based on the first signal-to-noise relation; second step size control circuit 20 for supplying a step size for determining the amount of correction of the filter coefficient of the second adaptive filter 8 based on the first signal-to-noise relation; third step size control circuit 17 for supplying a step size for determining the amount of correction of the filter coefficient of third adaptive filter 5 based on the third signal-to-noise relation; and fourth step size control circuit 18 for supplying a step size for similarly determining the amount of correction of the filter coefficient of fourth adaptive filter 6 based on the third signal-to-noise relation.

Essentially, the signal processor of the sixth embodiment shown in FIG. 10 is a device in which the second S/N ratio estimation circuit 22 has been eliminated from the signal processor shown in FIG. 5. As a result, the first signal-to-noise ratio is sent to step size control circuit 20 from first S/N ratio estimation circuit 21. The signal processor shown in FIG. 10 is otherwise equivalent to the device shown in FIG. 5, and the following explanation therefore regards only step size control circuit 20.

The input signal of step size control circuit 20 is first signal-to-noise ratio, SNR1(k) that is found in S/N ratio estimation circuit 21, and step size control circuit 10 supplies step size $\alpha_2(k)$ that is calculated based on SNR1(k) to adaptive filter 8.

$\alpha_2(k)$ can be similarly determined using SNR1(k), $SNR9_{max}$, $SNR9_{min}$, $\alpha_{9min}$, and $\alpha_{9max}$ in place of SNR2(k), $SNR2_{max}$, $SNR2_{min}$, $\alpha_{2min}$, and $\alpha_{2max}$ of Equations (11a) to (12c). In this case, $SNR9_{min}$ and $SNR9_{max}$ are constants satisfying the relation $SNR9_{min} < SNR9_{max}$, and $\alpha_{9min}$ and $\alpha_{9max}$ are constants satisfying the relation $\alpha_{9min} < \alpha_{9max}$.

Thus, using first signal-to-noise ratio found in S/N ratio estimation circuit 21 instead of providing second S/N ratio estimation circuit 22 and using the second signal-to-noise ratio found by second S/N ratio estimation circuit 22 enables the elimination of second S/N ratio estimation circuit 22 and enables the elimination of the amount of operations that pertain to the second S/N ratio estimation circuit.

Of course, based on the symmetry of the circuit structure in the present embodiment, first S/N ratio estimation circuit 21 may be eliminated instead of second S/N ratio estimation circuit 22 in the signal processor shown in FIG. 5, and the input signal of step size control circuit 19 may be the second signal-to-noise ratio which is found in S/N ratio estimation circuit 22.

The principles of operation of the signal processor of the sixth embodiment shown in FIG. 10 are similar to those of the previously described signal processor of the first embodiment. More specifically, the procedure of the sixth embodiment includes the steps (a1) to (a15) of the first embodiment, and further includes the steps of:

(a16e) generating a third signal-to-noise relation from the first received sound signal and the second received sound signal;

(a17e) supplying a step size for determining the amount of correction of the filter coefficients of first and second adaptive filters 7, 8 based on the first signal-to-noise relation; and (a18e) supplying a step size for determining the amount of correction of the filter coefficients of third and fourth adaptive filters 5, 6 based on the third signal-to-noise relation.

Figure 11:
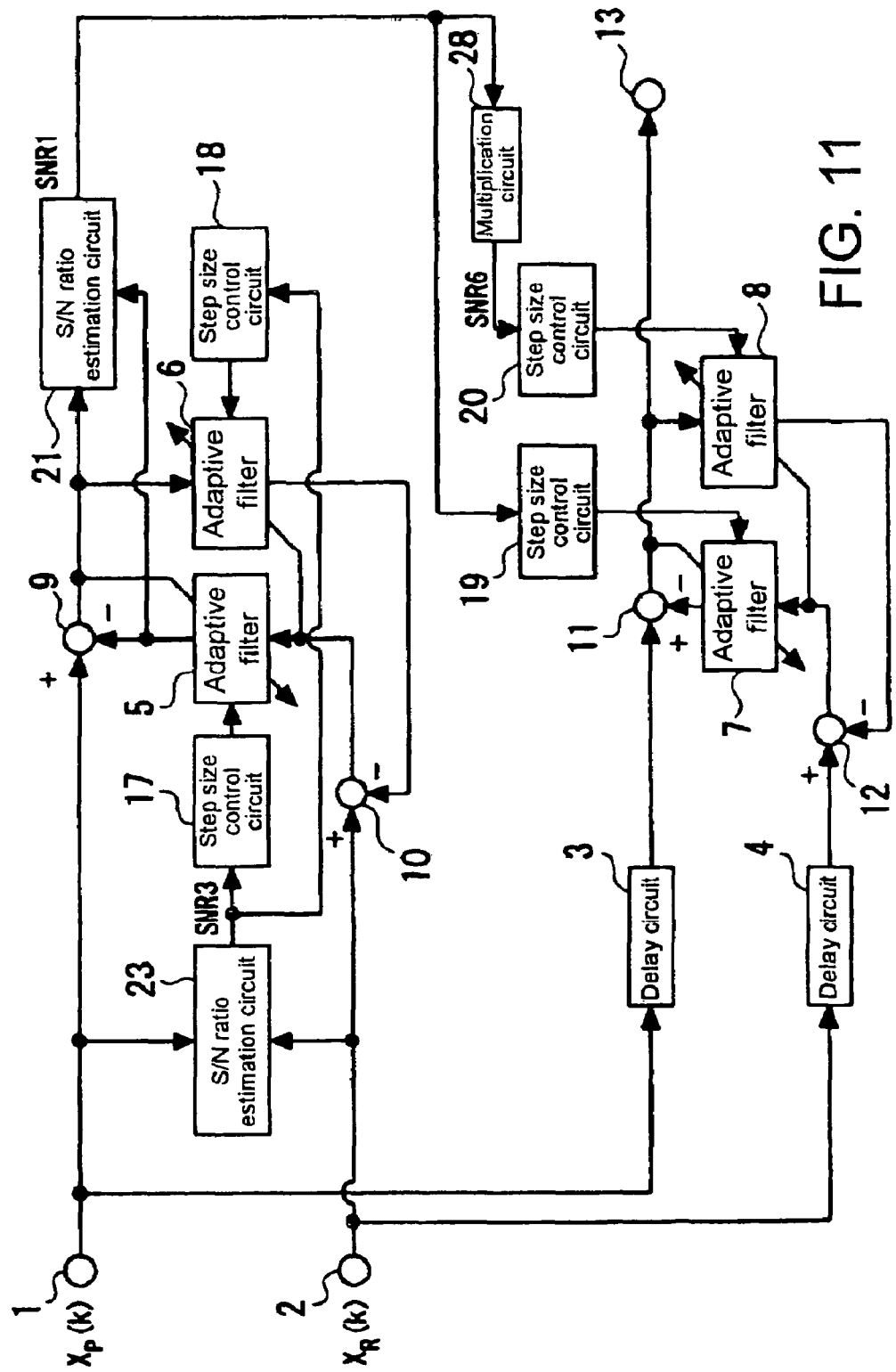
FIG. 11 is a block diagram showing the configuration of the signal processor according to the seventh embodiment of the present invention.

Explanation next regards the seventh embodiment of the present invention. In FIG. 11 which shows the signal processor of the seventh embodiment of the present invention, elements which are identical or equivalent to elements in FIG. 5 are given the same reference numerals.

The signal processor of the seventh embodiment shown in FIG. 11 is provided with: speech input terminal 1; reference input terminal 2; output terminal 13; first delay circuit 3 for receiving first received sound signal $X_P(k)$ as input from speech input terminal 1 and conferring a predetermined delay time to the first received sound signal to generate a first delayed received sound signal; second delay circuit 4 for receiving second received sound signal $X_R(k)$ as input from reference input terminal 2 and conferring to the second received sound signal a delay time which is the same as that of first delay circuit 3 to generate a second delayed received sound signal; first subtractor 11 for subtracting a first pseudo noise signal from the first delayed received sound signal to generate a first error signal; second subtractor 12 for subtracting the first pseudo speech signal from the second delayed received sound signal to generate a second error signal; first adaptive filter 7 for taking the second error signal from second subtractor 12 as input to generate the first pseudo noise signal and update the coefficient such that the first error signal is minimized; and second adaptive filter 8 for receiving the first error signal from the first subtractor 11 as input to generate the first pseudo speech signal and update the coefficient such that the second error signal is minimized; wherein the first error signal is further supplied to output terminal 13 as a speech signal from which noise has been cancelled.

This signal processor further includes: third subtractor 9 for subtracting the second pseudo noise signal from the first received sound signal to generate a third error signal; fourth subtractor 10 for subtracting the second pseudo speech signal from the second received sound signal to generate a fourth error signal; third adaptive filter 5 for receiving the fourth error signal as input to generate the second pseudo noise signal and update the coefficient such that the third error signal is minimized; fourth adaptive filter 6 for taking the third error signal as input to generate the second pseudo speech signal and update the coefficient such that the fourth error signal is minimized; first S/N ratio estimation circuit 21 for generating a first signal-to-noise relation from the third error signal and the second pseudo noise signal; a multiplication circuit 28 for multiplying a value predetermined from the first signal-to-noise relation to generate a sixth signal-to-noise relation; third S/N ratio estimation circuit 23 for generating a third signal-to-noise relation from the first received sound signal and the second received sound signal; first step size control circuit 19 for supplying a step size for determining the amount of correction of the filter coefficient of first adaptive filter 7 based on the first signal-to-noise relation; second step size control circuit 20 for supplying a step size for determining the amount of correction of the filter coefficient of second adaptive filter 8 based on the sixth signal-to-noise relation; third step size control circuit 17 for supplying a step size for determining the amount of correction of the filter coefficient of third adaptive filter 5 based on the third signal-to-noise relation; and fourth step size control circuit 18 for supplying a step size for determining the amount of correction of the filter coefficient of fourth adaptive filter 6 similarly based on the third signal-to-noise relation.

In other words, the signal processor of the seventh embodiment shown in FIG. 11 is a device in which second S/N ratio estimation circuit 22 has been eliminated from the signal processor of the first embodiment shown in FIG. 5 and multiplication circuit 28 provided in its place. The signal processor shown in FIG. 11 is otherwise similar to the device shown in FIG. 5, and the following explanation therefore regards only multiplication circuit 28.

Multiplication circuit 28 multiplies a predetermined value by the first signal-to-noise ratio supplied from S/N ratio estimation circuit 21 to find an approximate value of the second signal-to-noise ratio which is the output of the second S/N ratio estimation circuit. Multiplication circuit 28 supplies this approximate value to step size control circuit 20 as the sixth signal-to-noise ratio. Finding an approximate value of the second signal-to-noise ratio from the first signal-to-noise ratio which is found by S/N ratio estimation circuit 21 in this way eliminates the need for the second S/N ratio estimation circuit and enables the reduction of the amount of computation corresponding to the second S/N ratio estimation circuit.

Of course, due to the symmetry of the circuit configuration in the present embodiment, first S/N ratio estimation circuit 21 may be eliminated in place of second S/N ratio estimation circuit 22 in the signal processor shown in FIG. 5, the approximate value of the first signal-to-noise ratio may be found from the second signal-to-noise ratio which is supplied as output from the second S/N ratio estimation circuit, and this approximate value then taken as the input signal of step size control circuit 19.

The principles of operation of the signal processor of the seventh embodiment shown in FIG. 11 are similar to those of the previously described signal processor of the first embodiment. More specifically, the procedures in the seventh embodiment include the steps (a1) to (a15) of the first embodiment, and further include the steps of:

(a16f) multiplying a value which is predetermined from the first signal-to-noise relation to generate a sixth signal-to-noise relation;

(a17f) generating a third signal-to-noise relation from the first received sound signal and the second received sound signal;

(a18f) supplying a step size for determining the amount of correction of the filter coefficient of first adaptive filter 7 based on the first signal-to-noise relation;

(a19f) supplying a step size for determining the amount of correction of the filter coefficient of second adaptive filter 8 based on the sixth signal-to-noise relation; and (a20f) supplying a step size for determining the amounts of correction of the filter coefficients of third and fourth adaptive filters 5, 6 based on the third signal-to-noise relation.

Figure 12:
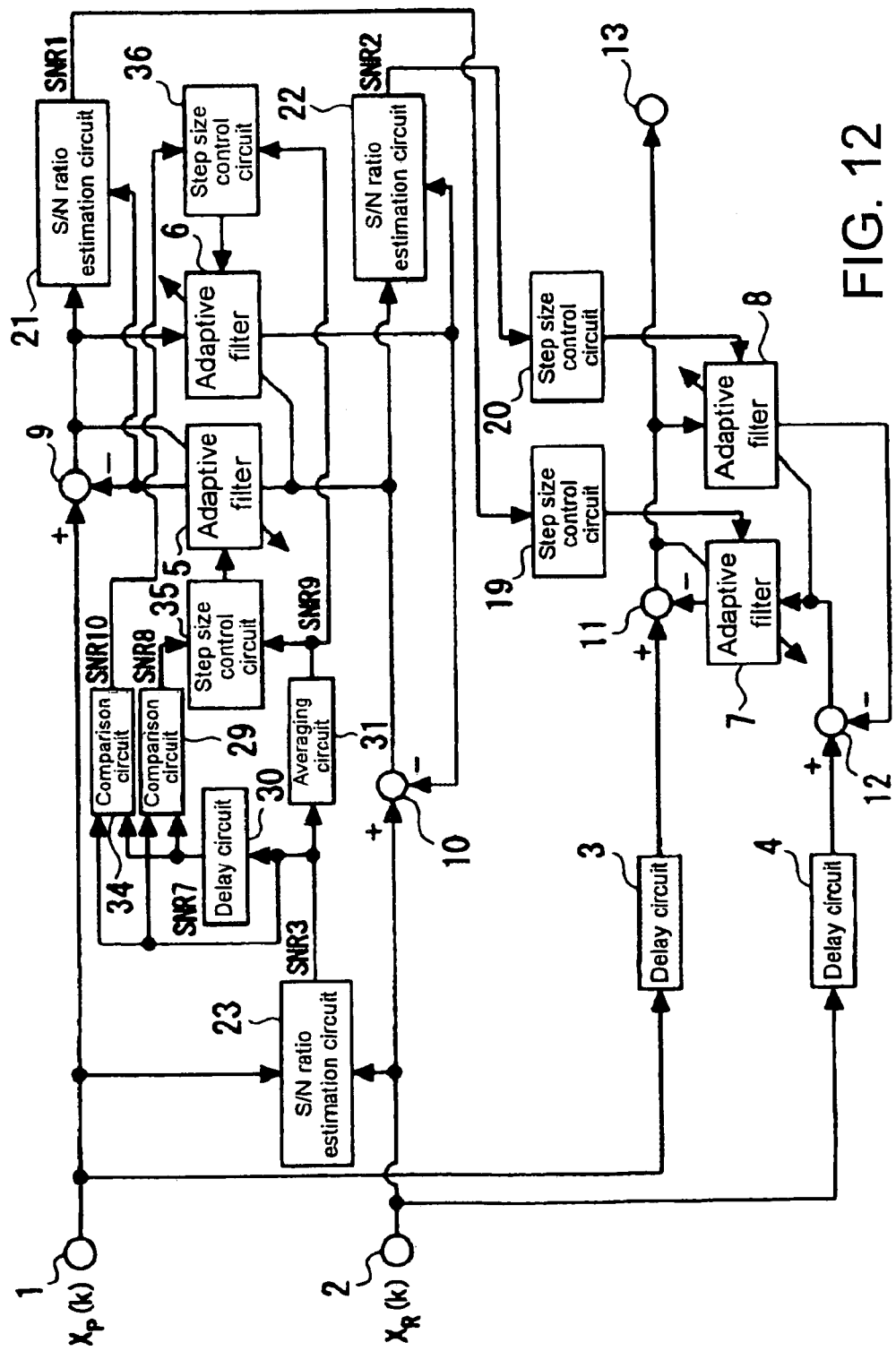
FIG. 12 is a block diagram showing the configuration of the signal processor according to the eighth embodiment of the present invention.

Explanation next regards the eighth embodiment of the present invention. In FIG. 12 that shows the signal processor of the eighth embodiment of the present invention, elements that are identical or equivalent to elements shown in FIG. 5 are given the same reference numerals.

The signal processor of the eighth embodiment shown in FIG. 12 is provided with: speech input terminal 1; reference input terminal 2; output terminal 13; first delay circuit 3 for receiving first received sound signal $X_P(k)$ as input from speech input terminal 1 and conferring a predetermined delay time to the first received sound signal to generate a first delayed received sound signal; second delay circuit 4 for receiving second received sound signal $X_R(k)$ as input from reference input terminal, 2 and conferring to the second received sound signal a delay time that is the same as that of first delay circuit 3 to generate a second delayed received sound signal; first subtractor 11 for subtracting a first pseudo noise signal from the first delayed received sound signal to generate a first error signal; second subtractor 12 for subtracting the first pseudo speech signal from the second delayed received sound signal to generate a second error signal; first adaptive filter 7 for taking the second error signal from second subtractor 12 as input to generate the first pseudo noise signal and update the coefficient such that the first error signal is minimized; and second adaptive filter 8 for receiving the first error signal from the first subtractor 11 as input to generate the first pseudo speech signal and update the coefficient such that the second error signal is minimized; wherein the first error signal is further supplied to output terminal 13 as a speech signal from which noise has been cancelled.

This signal processor further includes: third subtractor 9 for subtracting a second pseudo noise signal from the first received sound signal to generate a third error signal; fourth subtractor 10 for subtracting the second pseudo speech signal from the second received sound signal to generate a fourth error signal; third adaptive filter 5 for receiving the fourth error signal as input to generate the second pseudo noise signal and update the coefficient such that the third error signal is minimized; fourth adaptive filter 6 for taking the third error signal as input to generate the second pseudo speech signal and update the coefficient such that the fourth error signal is minimized; first S/N ratio estimation circuit 21 for generating a first signal-to-noise relation from the third error signal and the second pseudo noise signal; second S/N ratio estimation circuit 22 for generating a second signal-to-noise relation from the second pseudo speech signal and the fourth error signal; third S/N ratio estimation circuit 23 for generating a third signal-to-noise relation from the first received sound signal and the second received sound signal; third delay circuit 30 for conferring a predetermined delay time to the third signal-to-noise relation to generate a delayed signal-to-noise relation: comparison circuits 29, 34 for comparing the third signal-to-noise relation and the delayed signal-to-noise relation and supplying the larger value as extended signal-to-noise relation; averaging circuit 31 for time averaging the third signal-to-noise relation to generate an average signal-to-noise relation; first step size control circuit 19 for supplying a step size for determining the amount of correction of the filter coefficient of the first adaptive filter 7 based on the first signal-to-noise relation; second step size control circuit 20 for supplying a step size for determining the amount of correction of the filter coefficient of second adaptive filter 8 based on the second signal-to-noise relation; third step size control circuit 35 for supplying a step size for determining the amount of correction of the filter coefficient of third adaptive filter 5 based on the extended signal-to-noise relation and the average signal-to-noise relation; and fourth step size control circuit 36 for supplying a step size for determining the amount of correction of the filter coefficient of fourth adaptive filter 6 similarly based on the extended signal-to-noise relation and the average signal-to-noise relation.

Essentially, the signal processor of the eighth embodiment shown in FIG. 12 is a device in which comparison circuits 29, 34, delay circuit 30, and averaging circuit 31 are added to the signal processor of the first embodiment shown in FIG. 5, and further, in which step size control circuits 35, 36 are substituted for step size control circuits 17, 18. The device shown in FIG. 12 is otherwise of a similar configuration to that of the device shown in FIG. 5. The following explanation therefore regards only comparison circuits 29, 34, delay circuit 30, averaging circuit 31, and step size control circuits 35, 36.

Delay circuit 30, after delaying the signal-to-noise ratio which has been found in S/N ratio estimation circuit 23 for a fixed time, supplies the signal to comparison circuit 29 and comparison circuit 34 as the seventh signal-to-noise relation, i.e., the seventh delayed signal-to-noise ratio.

Comparison circuit 29 compares the third signal-to-noise ratio supplied from S/N ratio estimation circuit 23 with the seventh signal-to-noise ratio supplied from delay circuit 30, selects the signal-to-noise ratio having the higher value, and supplies this signal-to-noise ratio as the extended signal-to-noise relation, i.e., the eighth signal-to-noise ratio, to step size control circuit 35. The output of comparison circuit 29, compared with the third signal-to-noise ratio found in S/N ratio estimation circuit 23, is a form in which sections in which the signal-to-noise ratio is higher are extended in the positive time direction corresponding to the delay time which is conferred by delay circuit 30. Thus, through the selection of the output of comparison circuit 29 as a signal-to-noise ratio, intervals in which a small step size is obtained are also extended in the positive time direction, whereby accurate control of an adaptive filter can be realized at the point of completion of a speech interval.

Comparison circuit 34 compares the third signal-to-noise ratio supplied from S/N ratio estimation circuit 23 with the seventh signal-to-noise ratio supplied from delay circuit 30, selects the smaller value, and supplies this signal-to-noise ratio to step size control circuit 36 as the second extended signal-to-noise relation, i.e., the tenth signal-to-noise ratio. In other words, the output of comparison circuit 34 is of a form in which, compared to the third signal-to-noise ratio found by S/N ratio estimation circuit 23, sections in which the signal-to-noise ratio is lower are extended in the positive time direction corresponding to the delay time which is conferred by delay circuit 30. As a result, by the selection of the output of comparison circuit 34 as a signal-to-noise ratio, sections in which a small step size is obtained are also extended in the positive time direction, and a more accurate adaptive filter control can be realized at the point of completion of a speech section. As will be obvious from this explanation, instead of selecting the larger of the third signal-to-noise ratio and the seventh signal-to-noise ratio in the operation of comparison circuit 29, comparison circuit 34 operates by selecting the smaller signal-to-noise ratio and taking this signal-to-noise ratio as tenth signal-to-noise ratio. Accordingly, the same effect as described above can be obtained by omitting comparison circuit 34 and using a circuit having the function of taking, as comparison circuit 29, the larger of the third signal-to-noise ratio and the seventh signal-to-noise ratio as eighth signal-to-noise ratio and taking smaller of the two signal-to-noise ratios as the tenth signal-to-noise ratio.

In averaging circuit 31, the result of calculating the average of third signal-to-noise ratio SNR3(k) supplied from S/N ratio estimation circuit 23 from time k−m+1 until k is supplied to step size control circuits 35, 36 as ninth signal-to-noise ratio SNR9(k). This relation can be represented by Equation (23):

$$SNR9(k) = \left(\frac{1}{M}\right)\sum_{i=0}^{M-1} SNR3(k-i) \quad (23)$$

Step size control circuit 35 supplies adaptive filter 5 with step size $\alpha_3(k)$ which is calculated based on eighth signal-to-noise ratio SNR8(k) found in comparison circuit 29 and ninth signal-to-noise ratio SNR9(k) found in averaging circuit 31.

At time k, step size control circuit 35 takes SNR8(k) and SNR9(k) as input and calculates step size $\alpha_3(k)$. This relation can be represented by Equations (24a) to (24c) and (25):

$\alpha_3(k) = \alpha_{10max}$ $(g_1(k) < SNR10_{min})$ (24a)

$\alpha_3(k) = g_1(k)$ $(SNR10_{min} \leq g_1(k) \leq SNR10_{max})$ (24b)

$\alpha_3(k) = \alpha_{10min}$ $(g_1(k) > SNR10_{max})$ (24c)

$g_1(k) = -A(SNR9(k)) \cdot SNR8(k) + B(SNR9(k))$ (25)

Here, $SNR10_{min}$ and $SNR10_{max}$ are constants satisfying the relation $SNR10_{min} < SNR10_{max}$, $\alpha_{10min}$ and $\alpha_{10max}$ are constants satisfying the relation $\alpha_{10min} < \alpha_{10max}$; and A(SNR9(k)) and B(SNR9(k)) are parameters which are determined by SNR9(k).

A(SNR9(k)) and B(SNR9(k)) can be taken as the following Equations (26a) to (26c) and (27a) to (27c):

$A(SNR9(k)) = A_1$ $(SNR9(k) > SNR11_{max})$ (26a)

$A(SNR9(k)) = A_2$ $(SNR11_{min} \leq SNR9(k) \leq SNR11_{max})$ (26b)

$A(SNR9(k)) = A_3$ $(SNR9(k) < SNR11_{min})$ (26c)

$B(SNR9(k)) = B_1$ $(SNR9(k) > SNR11_{max})$ (27a)

$B(SNR9(k)) = B_2$ $(SNR11_{min} \leq SNR9(k) \leq SNR11_{max})$ (27b)

$B(SNR9(k)) = B_3$ $(SNR9(k) < SNR11_{min})$ (27c)

In this case, $SNR11_{min}$ and $SNR11_{max}$ are constants satisfying the relation $SNR11_{min} < SNR11_{max}$, and $A_1, A_2, A_3, B_1, B_2$, and $B_3$ are positive constants.

In other words, the values of A and B in $f_1(x)$ of Equation (9a) are set to appropriate values based on the values of SNR3(k).

Step size control circuit 36 supplies adaptive filter 6 with step size $\alpha_4(k)$ which is calculated based on tenth signal-to-noise ratio SNR10(k) found in comparison circuit 34 and ninth signal-to-noise ratio SNR9(k) found in averaging circuit 31. This relation can be represented by Equations (28a) to (28c) and (29):

$\alpha_4(k) = \alpha_{11min}$ $(g_2(k) < SNR12_{min})$ (28a)

$\alpha_4(k) = \alpha_2(k)$ $(SNR12_{min} \leq g_2(k) \leq SNR12_{max})$ (28b)

$\alpha_4(k) = \alpha_{11max}$ $(g_2(k) > SNR12_{max})$ (28c)

$g_2(k) = C(SNR9(k)) \cdot SNR10(k) + D(SNR9(k))$ (29)

Here, $SNR12_{min}$ and $SNR12_{max}$ are constants satisfying the relation $SNR12_{min} < SNR12_{max}$; and C(SNR9(k)) and D(SNR9(k)) are parameters that are determined by SNR9(k).

C(SNR9(k)) and D(SNR9(k)) can be determined similarly to A(SNR9(k)) and B(SNR9(k)) by using $C_1, C_2, C_3, D_1, D_2, D_3, SNR13_{min}$, and $SNR13_{max}$ in place of $A_1, A_2, A_3, B_1, B_2, B_3, SNR11_{min}$, and $SNR11_{max}$ in Equations (26a) to (26)c. In this case, $SNR13_{min}$ and $SNR13_{max}$ are constants satisfying the relation $SNR13_{min} < SNR13_{max}$, and $C_1, C_2, C_3, D_1, D_2$ and $D_3$ are positive constants.

In other words, the values of C and D in $f_2(x)$ in Equation (12a) above is set to an appropriate value based on the value of SNR3(k).

As previously explained, in place of the third signal-to-noise ratio found in S/N ratio estimation circuit 23, the extended value and the average value of the third signal-to-noise ratio found in S/N ratio estimation circuit 23 are supplied to step size control circuits 35, 36 to calculate the step size, whereby the optimum step size can be calculated even when the signal-to-noise ratio takes values over a broad range.

In addition, the above-described signal processor may be of a configuration in which averaging circuit 31 is omitted and A(SNR9(k)), B(SNR9(k)), C(SNR9(k)), and D(SNR9(k)) are replaced by constants.

Still further, the above-described signal processor may also be a configuration in which, for the outputs of S/N ratio estimation circuit 21 and S/N ratio estimation circuit 22, the average value and value in which sections of high or low signal-to-noise ratio are extended in the positive time direction are supplied to step size control circuits 19, 20 and the step size then calculated. In this case, the averaging circuit can also be omitted.

The principles of operation of the signal processor of the eighth embodiment shown in FIG. 12 are similar to those of the above-described signal processor of the first embodiment. More specifically, the procedures in the eighth embodiment include the steps (a1) to (a17) in the first embodiment, and further include the steps of:

(a18g) conferring a predetermined delay time to the third signal-to-noise relation to generate a delayed signal-to-noise relation;

(a19g) comparing the third signal-to-noise relation and the delayed signal-to-noise relation and supplying the larger value as the extended signal-to-noise relation;

(a20g) averaging the third signal-to-noise relation over time to generate an average signal-to-noise relation;

(a21g) supplying a step size for determining the amount of correction of the filter coefficient of first adaptive filter 7 based on the first signal-to-noise relation;

(a22g) supplying a step size for determining the amount of correction of the filter coefficient of second adaptive filter 8 based on the second signal-to-noise relation; and (a23g) supplying a step size for determining the amount of correction of the filter coefficient of third and fourth adaptive filters 5, 6 based on the extended signal-to-noise relation and the average signal-to-noise relation.

In the above-described first to eighth embodiments, S/N ratio estimation circuits 21, 22, 23 operate to find the power ratios of signal components which are supplied and noise components which are supplied. However, it will be obvious that operation may be realized in S/N ratio estimation circuits 21, 22, 23 for finding absolute amplitude ratios of signals instead of power ratios. Still further, S/N ratio estimation circuits 21, 22, 23 may be configured to add a constant to the power of noise components (or the absolute amplitudes) to correct the values of estimated signal-to-noise ratios. This correction is effective for achieving stable operation by avoiding division by zero when the power (or absolute amplitude) of the noise component is extremely close to zero. Similarly, in S/N ratio estimation circuits 21, 22, 23, constants may be added to signal component, which are numerators, for power ratios or absolute amplitude ratios. By extending this approach, specific operations may be implemented for each of the denominator and numerator which make up a signal-to-noise ratio and the ratio then taken. In other words, the values that are found in S/N ratio estimation circuits 21, 22, 23 need not be the ratio of the powers of a signal and noise or the absolute amplitudes in the strictest sense, but rather, may be a value corresponding to a concept that represents the relation between a signal and noise.

In each of the above-described embodiments, explanation regarded the cancellation of noise contained in an input speech signal as an example of the signal processing on which the present invention is based. However, as shown in Reference [27], each of the above-described devices can be used in echo cancellation if a reference signal is supplied to input terminal 2 and an echo signal is supplied to input terminal 1.

Figure 13:
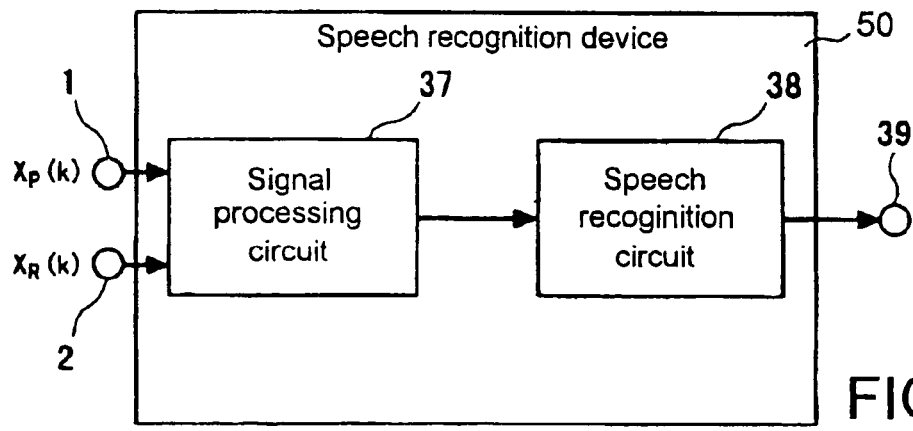
FIG. 13 is a block diagram showing an example of the configuration of a speech recognition device which uses the signal processor of the present invention.

FIG. 13 is a block diagram showing an example in which the above-described signal processor is used to realize a speech recognition device. Speech recognition device 50 is provided with: signal processing circuit 37 composed of the signal processor in each of the embodiments described above; and speech recognition circuit 38 for performing speech recognition for the output signal of signal processing circuit 37 and supplying the result of recognition to output terminal 39. By providing signal processing circuit 37 based on the present invention in the stage preceding speech recognition circuit 38, noise is canceled from the speech signal which is the object of recognition to realize a speech recognition device which is capable of more accurate speech recognition.

Figure 14:
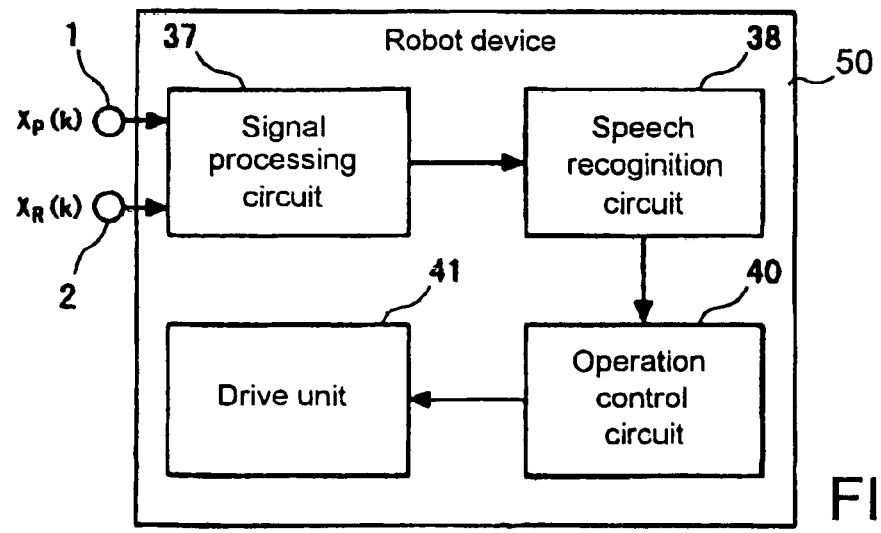
FIG. 14 is a block diagram showing an example of a robot which uses the signal processor of the present invention.

Further, as shown in FIG. 14, robot device 60 can be realized by providing the configuration shown in FIG. 13 with: operation control circuit 40 for receiving the output of speech recognition circuit 38 and supplying operation control signals; and drive unit 41 for taking the operation control signals as input and causing prescribed parts to operate.

According to the above-described embodiments: a signal-to-noise ratio, which is an index of the relation between signals, is estimated in an S/N ratio estimation circuit; an adaptive filter having step sizes which are appropriately controlled through the use of this estimated values is operated; and a signal-to-noise ratio which is estimated based on the output signal of this adaptive filter is used to determine the step size of another adaptive filter; whereby signal processing can be realized for input signals having a signal-to-noise ratio that varies over a broad range in a speech input terminal and reference input terminal, this signal processing being characterized by shorter convergence time and little distortion in the output speech.

In each of the embodiments of the present invention, the S/N ratio estimation circuits can employ a configuration that includes: first averaging circuit 14 for receiving estimated values of input signals and calculating the average value of these estimated values to supply the average value of the estimated speech signal; second averaging circuit 15 for receiving the estimated values of noise signals and calculating the average value of these estimated values to supply the average value of estimated noise signals; and operation circuit 16 for calculating the ratio of the average value of the estimated speech signals to the average value of the estimated noise signals and supplying the signal-to-noise ratio, as shown in FIG. 3.

Further modifications are also possible in the present invention.

According to one embodiment of the present invention, a configuration may be adopted in which first step size control circuit 19 receives as input the signal-to-noise ratio supplied from S/N ratio estimation circuit 21 and, when the signal-to-noise ratio is high, supplies a step size of a smaller value than when the signal-to-noise ratio is low.

According to one embodiment of the present invention, a configuration may be adopted in which second step size control circuit 20 receives as input the signal-to-noise ratio supplied by S/N ratio estimation circuit 22 and, when the signalto-noise ratio is low, supplies a step size of a value lower than when the signal-to-noise ratio is high.

According to one embodiment of the present invention, a configuration may be adopted in which third step size control circuit 17 receives as input the signal-to-noise ratio supplied by S/N ratio estimation circuit 23 and, when the signal-to-noise ratio is high, supplies a step size of a lower value than when the signal-to-noise ratio is low.

According to one embodiment of the present invention, a configuration may be adopted in which fourth step size control circuit 18 receives as input the signal-to-noise ratio supplied by S/N ratio estimation circuit 23 and, when the signal-to-noise ratio is low, supplies a step size of a value lower than when the signal-to-noise ratio is high.

According to one embodiment of the present invention, a configuration may be adopted in which third step size control circuit 17 receives the extended signal-to-noise ratio and average signal-to-noise ratio as input, and when an addition value, which is obtained by adding a constant determined by the average signal-to-noise ratio to a multiplication value obtained by multiplying the extended signal-to-noise ratio by a coefficient that is determined by the average signal-to-noise ratio, is within a range between a predetermined maximum value and minimum value, supplies the addition value as a step size, supplies the predetermined minimum step size as the step size when the addition value is higher than the maximum value, and supplies the predetermined maximum step size as the step size when the addition value is lower than the minimum value.

According to one embodiment of the present invention, a configuration may be adopted in which fourth step size control circuit 18 receives the extended signal-to-noise ratio and average signal-to-noise ratio as input, and when an addition value, which is obtained by adding a constant determined by the average signal-to-noise ratio to a multiplication value that is obtained by multiplying the extended signal-to-noise ratio by a coefficient determined by the average signal-to-noise ratio, is within a range between a predetermined maximum value and minimum value, supplies the addition value as the step size, supplies the predetermined maximum step size as the step size when the addition value is higher than the maximum value, and supplies the predetermined minimum step size as the step size when the addition value is lower than the minimum value.

A signal processor based on the above-described present invention can be realized by means of software. In other words, a program that is used in signal processing can be realized by constituting the processing operations of each circuit of the signal processors of each of the above-described embodiments as steps or procedures in software. Such a program is executed by a processor such as a DSP (Digital Signal Processor) that makes up a signal processor or noise canceller.

Finally, a program product that is composed of such a program or a memory medium in which such a program is stored is also included within the sphere of the present invention.

The invention claimed is:

1. A signal processing method comprising steps of: using a first signal and a second signal that contains a desired signal to calculate a first index through a first index indicating an intensity ratio between said first signal and said second signal;

using said first signal, said second signal, and said first index to calculate a second index through a second circuit indicating an intensity ratio between said desired signal and signals other than said desired signal; and using said first signal, said second signal, and said second index to extract said desired signal.

2. A signal processing method, comprising the steps of:

generating a first pseudo signal by means of a first adaptive filter that takes a first signal as input;

generating a first differential signal by subtracting said first pseudo signal from a second signal;

using said first differential signal to update a coefficient of said first adaptive filter;

generating a second pseudo signal by means of a second adaptive filter that takes said first signal as input;

generating a second differential signal by subtracting said second pseudo signal from said second signal;

using said second differential signal to update a coefficient of said second adaptive filter;

using a first step size that is controlled in accordance with an intensity ratio between said second pseudo signal and said second differential signal to control updating of the coefficient of said first adaptive filter;

using a second step size that is controlled in accordance with an intensity ratio between said first signal and said second signal to control updating of the coefficient of said second adaptive filter; and supplying said first differential signal as output.

3. The signal processing method according to claim 2, wherein said first and second signals are delayed before processing by said first adaptive filter or said first and third adaptive filters.

4. The signal processing method according to claim 2, wherein said first and second signals are decimated before processing by said first adaptive filter or said first arid third adaptive filters.

5. A signal processor comprising:

a first calculation circuit for receiving, as input, a first signal and a second signal that both contain a desired signal with different rates of content and calculating a first index that indicates an intensity ratio between said first signal and said second signal;

a second calculation circuit for receiving said first signal, said second signal, and said first index as input and calculating a second index that indicates an intensity ratio between said desired signal and signals other than the desired signal; and a signal processing circuit for receiving said first signal, said second signal, and said second index as input for extracting said desired signal.

6. A signal processor for receiving, as input, a first signal and a second signal that both contain a desired signal with different rates of content and extracting the desired signal; said signal processor comprising:

a calculation circuit for calculating an intensity ratio between said first signal and said second signal;

a first signal processing means for receiving said first signal and said second signal as input; and a second signal processing means for receiving said first signal and said second signal;

wherein an output of said calculation circuit is used to control operation of said first signal processing means, and an output of said first signal processing means is used to control operation of said second signal processing means.

7. A signal processor comprising:

a first adaptive filter for taking a first signal as input and generating a first pseudo signal;

a first subtractor for generating a first differential signal by subtracting said first pseudo signal from a second signal;

a second adaptive filter for taking said first signal as input and generating a second pseudo signal;

a second subtractor for generating a second differential signal by subtracting said second pseudo signal from said second signal;

a first step size control means for generating a first step size in accordance with an intensity ratio between said second pseudo signal and said second differential signal; and a second step size control means for generating a second step size in accordance with an intensity ratio between said first signal and said second signal;

wherein said first differential signal and said first step size are used to update a coefficient of said first adaptive filter; said second differential signal and said second step size are used to update a coefficient of said second adaptive filter; and said first differential signal is supplied as output.

8. The signal processor according to claim 7 further comprising:

a first delay circuit for delaying said first signal that is applied as input to said third subtractor; and a second delay circuit for delaying said second signal that is applied as input to said first subtractor.

9. The signal processor according to claim 7 further comprising:

a first decimation circuit for decimating said first signal that is applied as input to said fourth subtractor; and a second decimation circuit for decimating said second signal that is applied as input to said second subtractor.

10. A signal processing method for receiving a first signal and a second signal as input, said signal processing method comprising the steps of:

generating a first pseudo signal by means of a first adaptive filter that takes a first intermediate signal as input, generating a first differential signal by subtracting said first pseudo signal from said second signal, and using said first differential signal to update a coefficient of said first adaptive filter;

generating a second pseudo signal by means of a second adaptive filter that takes a second intermediate signal as input, generating a second differential signal by subtracting said second pseudo signal from said second signal, and using said second differential signal to update a coefficient of said second adaptive filter;

generating a third pseudo signal by means of a third adaptive filter that takes said first differential signal as input, generating a third differential signal by subtracting said third pseudo signal from said first signal, applying said third differential signal to said first adaptive filter as said first intermediate signal, and using said third differential signal to update a coefficient of said third adaptive filter;

generating a fourth pseudo signal by means of a fourth adaptive filter that takes said second differential signal as input, generating a fourth differential signal by subtracting said fourth pseudo signal from said first signal, applying said fourth differential signal to said second adaptive filter as said second intermediate signal, and using said fourth differential signal to update a coefficient of said fourth adaptive filter;

based on relation between signals, using a first step size to control updating the coefficient of said first adaptive filter, using a second step size to control updating of the coefficient of said second adaptive filter, using a third step size to control updating of the coefficient of said third adaptive filter, and using a fourth step size to control updating of the coefficient of said fourth adaptive filter; and supplying said first differential signal as output, wherein said first step size is controlled in accordance with the relation between said second pseudo signal and said second differential signal, said second step size is controlled in accordance with either one of the relation between said first signal and said second signal and the relation between said second pseudo signal and said second differential signal, said third step size is controlled in accordance with the relation between said fourth pseudo signal and said fourth differential signal, and said fourth step size is controlled in accordance with either one of the relation between said first signal and said second signal and the relation between said fourth pseudo signal and said fourth differential signal.

11. The signal processing method according to claim 10, wherein said first and second signals are delayed before processing by said first adaptive filter or said first and third adaptive filters.

12. The signal processing method according to claim 10, wherein said first and second signals are decimated before processing by said first adaptive filter or said first and third adaptive filters.

13. A signal processing method for receiving a first signal and a second signal as input, said signal processing method comprising the steps of:

generating a first delayed signal by delaying said first signal and generating a second delayed signal by delaying said second signal;

generating a first pseudo signal by means of a first adaptive filter that takes a first intermediate signal as input, generating a first differential signal by subtracting said first pseudo signal from said second delayed signal, and using said first differential signal to update a coefficient of said first adaptive filter;

generating a second pseudo signal by means of a second adaptive filter that takes a second intermediate signal as input, generating a second differential signal by subtracting said second pseudo signal from said second signal, and using said second differential signal to update a coefficient of said second adaptive filter;

generating a third pseudo signal by means of a third adaptive filter that takes said first differential signal as input, generating a third differential signal by subtracting said third pseudo signal from said first delayed signal, applying said third differential signal to said first adaptive filter as said first intermediate signal, and using said third differential signal to update a coefficient of said third adaptive filter;

generating a fourth pseudo signal by means of a fourth adaptive filter that takes said second differential signal as input, generating a fourth differential signal by subtracting said fourth pseudo signal from said first signal, applying said fourth differential signal to said second adaptive filter as said second intermediate signal, and using said fourth differential signal to update a coefficient of said fourth adaptive filter;

based on relation between signals, using a first step size to control updating the coefficient of said first adaptive filter, using a second step size to control updating of the coefficient of said second adaptive filter, using a third step size to control updating of the coefficient of said third adaptive filter, and using a fourth step size to control updating of the coefficient of said fourth adaptive filter; and supplying said first differential signal as output, wherein said first step size is controlled in accordance with the relation between said second pseudo signal and said second differential signal, said second step size is controlled in accordance with either one of the relation between said first signal and said second signal and the relation between said second pseudo signal and said second differential signal, said third step size is controlled in accordance with the relation between said fourth pseudo signal and said fourth differential signal, and said fourth step size is controlled in accordance with either one of the relation between said first signal and said second signal and the relation between said fourth pseudo signal and said fourth differential signal.

14. The signal processing method according to claim 13, wherein said first and second signals are delayed before processing by said first adaptive filter or said first and third adaptive filters.

15. The signal processing method according to claim 13, wherein said first and second signals are decimated before processing by said first adaptive filter or said first and third adaptive filters.

16. A signal processing method for receiving a first signal and a second signal as input, said signal processing method comprising the steps of:

generating a first pseudo signal by means of a first adaptive filter that takes a first intermediate signal as input, generating a first differential signal by subtracting said first pseudo signal from said second signal, and using said first differential signal to update a coefficient of said first adaptive filter;

generating a second pseudo signal by means of a second adaptive filter that takes a second intermediate signal as input, generating a second differential signal by subtracting said second pseudo signal from said second signal, and using said second differential signal to update a coefficient of said second adaptive filter;

generating a third pseudo signal by means of a third adaptive filter that takes said first differential signal as input, generating a third differential signal by subtracting said third pseudo signal from said first signal, applying said third differential signal to said first adaptive filter as said first intermediate signal, and using said third differential signal to update a coefficient of said third adaptive filter;

generating a fourth pseudo signal by means of a fourth adaptive filter that takes said second differential signal as input, generating a fourth differential signal by subtracting said fourth pseudo signal from said first signal, applying said fourth differential signal to said second adaptive filter as said second intermediate signal, and using said fourth differential signal to update a coefficient of said fourth adaptive filter;

based on relation between signals, using a first step size to control updating of the coefficient of said first adaptive filter, using a second step size to control updating of the coefficient of said second adaptive filter, using a third step size to control updating of the coefficient of said third adaptive filter, and using a fourth step size to control updating of the coefficient of said fourth adaptive filter; and supplying said first differential signal as output, wherein said first step size is controlled in accordance with the relation between said second pseudo signal and said second differential signal, said second step size is controlled in accordance with the relation between said first signal and said second signal, said third step size is controlled in accordance with the relation between said second pseudo signal and said second differential signal, and said fourth step size is controlled in accordance with the relation between said first signal and said second signal.

17. The signal processing method according to claim 16, wherein said first and second signals are delayed before processing by said first adaptive filter or said first and third adaptive filters.

18. The signal processing method according to claim 16, wherein said first and second signals are decimated before processing by said first adaptive filter or said first and third adaptive filters.

19. A signal processing method for receiving a first signal and a second signal as input, said signal processing method comprising the steps of:

generating a first delayed signal by delaying said first signal and generating a second delayed signal by delaying said second signal;

generating a first pseudo signal by means of a first adaptive filter that takes a first intermediate signal as input, generating a first differential signal by subtracting said first pseudo signal from said second delayed signal, and using said first differential signal to update a coefficient of said first adaptive filter;

generating a second pseudo signal by means of a second adaptive filter that takes a second intermediate signal as input, generating a second differential signal by subtracting said second pseudo signal from said second signal, and using said second differential signal to update a coefficient of said second adaptive filter;

generating a third pseudo signal by means of a third adaptive filter that takes said first differential signal as input, generating a third differential signal by subtracting said third pseudo signal from said first delayed signal, applying said third differential signal to said first adaptive filter as said first intermediate signal, and using said third differential signal to update a coefficient of said third adaptive filter;

generating a fourth pseudo signal by means of a fourth adaptive filter that takes said second differential signal as input, generating a fourth differential signal by subtracting said fourth pseudo signal from said first signal, applying said fourth differential signal to said second adaptive filter as said second intermediate signal, and using said fourth differential signal to update a coefficient of said fourth adaptive filter;

based on relation between signals, using a first step size to control updating the coefficient of said first adaptive filter, using a second step size to control updating of the coefficient of said second adaptive filter, using a third step size to control updating of the coefficient of said third adaptive filter, and using a fourth step size to control updating of the coefficient of said fourth adaptive filter; and supplying said first differential signal as output, wherein said first step size is controlled in accordance with the relation between said second pseudo signal and said second differential signal, said second step size is controlled in accordance with the relation between said first signal and said second signal, said third step size is controlled in accordance with the relation between said second pseudo signal and said second differential signal, and said fourth step size is controlled in accordance with the relation between said first signal and said second signal.

20. The signal processing method according to claim 19, wherein said first and second signals are delayed before processing by said first adaptive filter or said first and third adaptive filters.

21. The signal processing method according to claim 19, wherein said first and second signals are decimated before processing by said first adaptive filter or said first and third adaptive filters.

22. A signal processing method for receiving a first signal and a second signal as input, said signal processing method comprising the steps of:

generating a first pseudo signal by means of a first adaptive filter that takes a first intermediate signal as input, generating a first differential signal by subtracting said first pseudo signal from said second signal, and using said first differential signal to update a coefficient of said first adaptive filter;

generating a second pseudo signal by means of a second adaptive filter that takes a second intermediate signal as input, generating a second differential signal by subtracting said second pseudo signal from said second signal, and using said second differential signal to update a coefficient of said second adaptive filter;

generating a third pseudo signal by means of a third adaptive filter that takes said first differential signal as input, generating a third differential signal by subtracting said third pseudo signal from said first signal, applying said third differential signal to said first adaptive filter as said first intermediate signal, and using said third differential signal to update a coefficient of said third adaptive filter;

generating a fourth pseudo signal by means of a fourth adaptive filter that takes said second differential signal as input, generating a fourth differential signal by subtracting said fourth pseudo signal from said first signal, applying said fourth differential signal to said second adaptive filter as said second intermediate signal, and using said fourth differential signal to update a coefficient of said fourth adaptive filter;

based on relation between signals, using a first step size to control updating of the coefficient of said first adaptive filter, using a second step size to control updating of the coefficient of said second adaptive filter, using a third step size to control updating of the coefficient of said third adaptive filter, and using a fourth step size to control updating of the coefficient of said fourth adaptive filter; and supplying said first differential signal as output, wherein said first step size is controlled in accordance with the relation between said fourth pseudo signal and said fourth differential signal, said second step size is controlled in accordance with the relation between said first signal and said second signal, said third step size is controlled in accordance with the relation between said fourth pseudo signal and said fourth differential signal, and said fourth step size is controlled in accordance with the relation between said first signal and said second signal.

23. The signal processing method according to claim 22, wherein said first and second signals are delayed before processing by said first adaptive filter or said first and third adaptive filters.

24. The signal processing method according to claim 22, wherein said first and second signals are decimated before processing by said first adaptive filter or said first and third adaptive filters.

25. A signal processing method for receiving a first signal and a second signal as input, said signal processing method comprising the steps of:

generating a first delayed signal by delaying said first signal and generating a second delayed signal by delaying said second signal;

generating a first pseudo signal by means of a first adaptive filter that takes a first intermediate signal as input, generating a first differential signal by subtracting said first pseudo signal from said second delayed signal, and using said first differential signal to update a coefficient of said first adaptive filter;

generating a second pseudo signal by means of a second adaptive filter that takes a second intermediate signal as input, generating a second differential signal by subtracting said second pseudo signal from said second signal, and using said second differential signal to update a coefficient of said second adaptive filter;

generating a third pseudo signal by means of a third adaptive filter that takes said first differential signal as input, generating a third differential signal by subtracting said third pseudo signal from said first delayed signal, applying said third differential signal to said first adaptive filter as said first intermediate signal, and using said third differential signal to update a coefficient of said third adaptive filter;

generating a fourth pseudo signal by means of a fourth adaptive filter that takes said second differential signal as input, generating a fourth differential signal by subtracting said fourth pseudo signal from said first signal, applying said fourth differential signal to said second adaptive filter as said second intermediate signal, and using said fourth differential signal to update a coefficient of said fourth adaptive filter;

based on relation between signals, using a first step size to control updating the coefficient of said first adaptive filter, using a second step size to control updating of the coefficient of said second adaptive filter, using a third step size to control updating of the coefficient of said third adaptive filter, and using a fourth step size to control updating of the coefficient of said fourth adaptive filter; and supplying said first differential signal as output, wherein said first step size is controlled in accordance with the relation between said fourth pseudo signal and said fourth differential signal, said second step size is controlled in accordance with the relation between said first signal and said second signal, said third step size is controlled in accordance with the relation between said fourth pseudo signal and said fourth differential signal, and said fourth step size is controlled in accordance with the relation between said first signal and said second signal.

26. The signal processing method according to claim 25, wherein said first and second signals are delayed before processing by said first adaptive filter or said first and third adaptive filters.

27. The signal processing method according to claim 25, wherein said first and second signals are decimated before processing by said first adaptive filter or said first and third adaptive filters.

28. A signal processor for receiving a first signal and a second signal as input, said signal processor comprising:

a first adaptive filter for taking a first intermediate signal as input and generating a first pseudo signal;

a first subtractor for generating a first differential signal by subtracting said first pseudo signal from said second signal;
a second adaptive filter for taking a second intermediate signal as input and generating a second pseudo signal;
a second subtractor for generating a second differential signal by subtracting said second pseudo signal from said second signal;
a third adaptive filter for taking said first differential signal as input and generating a third pseudo signal;
a third subtractor for generating a third differential signal by subtracting said third pseudo signal from said first signal and supplying said third differential signal to said first adaptive filter as said first intermediate signal;
a fourth adaptive filter for taking said second differential signal as input and generating a fourth pseudo signal;
a fourth subtractor for generating a fourth differential signal by subtracting said fourth pseudo signal from said first signal and supplying said fourth differential signal to said second adaptive filter as said second intermediate signal; and
a step size control means for, based on relation between signals, generating a first step size, a second step size, a third step size, and a fourth step size;
wherein said first differential signal and said first step size are used to update a coefficient of said first adaptive filter; said second differential signal and said second step size are used to update a coefficient of said second adaptive filter; said third differential signal and said third step size are used to update a coefficient of said third adaptive filter; said fourth differential signal and said fourth step size are used to update a coefficient of said fourth adaptive filter; and said first differential signal is supplied as output, and
wherein said step size control means comprises:
a first step size control circuit for generating said first step size in accordance with the relation said second pseudo signal and said second differential signal;
a second step size control circuit for generating said second step size in accordance with either one of the relation between said first signal and said second signal or the relation between said second pseudo signal and said second differential signal;
a third step size control circuit for generating said third step size in accordance with the relation between said fourth pseudo signal and said fourth differential signal; and
a fourth step size control circuit for generating said fourth step size in accordance with either one of the relation between said first signal and said second signal or the relation between said fourth pseudo signal and said fourth differential signal.

29. The signal processor according to claim 28 further comprising:
a first delay circuit for conferring a delay to said first signal that is applied as input to said third subtractor; and
a second delay circuit for conferring a delay to said second signal that is applied as input to said first subtractor.

30. The signal processor according to claim 28 further comprising:
a first delay circuit for delaying said first signal that is applied as input to said third subtractor; and
a second delay circuit for delaying said second signal that is applied as input to said first subtractor.

31. The signal processor according to claim 28 further comprising:
a first decimation circuit for decimating said first signal that is applied as input to said fourth subtractor; and a second decimation circuit for decimating said second signal that is applied as input to said second subtractor.

32. A signal processor for receiving a first signal and a second signal as input, said signal processor comprising:
a first adaptive filter for taking a first intermediate signal as input and generating a first pseudo signal;
a first subtractor for generating a first differential signal by subtracting said first pseudo signal from said second signal;
a second adaptive filter for taking a second intermediate signal as input and generating a second pseudo signal;
a second subtractor for generating a second differential signal by subtracting said second pseudo signal from said second signal;
a third adaptive filter for taking said first differential signal as input and generating a third pseudo signal;
a third subtractor for generating a third differential signal by subtracting said third pseudo signal from said first signal and supplying said third differential signal to said first adaptive filter as said first intermediate signal;
a fourth adaptive filter for taking said second differential signal as input and generating a fourth pseudo signal;
a fourth subtractor for generating a fourth differential signal by subtracting said fourth pseudo signal from said first signal and supplying said fourth differential signal to said second adaptive filter as said second intermediate signal; and
a step size control means for, based on relation between signals, generating a first step size, a second step size, a third step size, and a fourth step size;
wherein said first differential signal and said first step size are used to update a coefficient of said first adaptive filter; said second differential signal and said second step size are used to update a coefficient of said second adaptive filter; said third differential signal and said third step size are used to update a coefficient of said third adaptive filter; said fourth differential signal and said fourth step size are used to update a coefficient of said fourth adaptive filter; and said first differential signal is supplied as output, and
wherein said step size control means comprises:
a first step size control circuit for generating said first step size in accordance with the relation between said second pseudo signal and said second differential signal;
a second step size control circuit for generating said second step size in accordance with the relation between said first signal and said second signal;
a third step size control circuit for generating said third step size in accordance with the relation between said second pseudo signal and said second differential signal; and
a fourth step size control circuit for generating said fourth step size in accordance with the relation between said first signal and said second signal.

33. The signal processor according to claim 32 further comprising:
a first delay circuit for conferring a delay to said first signal that is applied as input to said third subtractor; and
a second delay circuit for conferring a delay to said second signal that is applied as input to said first subtractor.

34. The signal processor according to claim 32 further comprising;
a first delay circuit for delaying said first signal that is applied as input to said third subtractor; and
a second delay circuit for delaying said second signal that is applied as input to said first subtractor.

35. The signal processor according to claim 32 further comprising:

a first decimation circuit for decimating said first signal that is applied as input to said fourth subtractor; and a second decimation circuit for decimating said second signal that is applied as input to said second subtractor.

36. A signal processor for receiving a first signal and a second signal as input, said signal processor comprising:

a first adaptive filter for taking a first intermediate signal as input and generating a first pseudo signal;

a first subtractor for generating a first differential signal by subtracting said first pseudo signal from said second signal;

a second adaptive filter for taking a second intermediate signal as input and generating a second pseudo signal;

a second subtractor for generating a second differential signal by subtracting said second pseudo signal from said second signal;

a third adaptive filter for taking said first differential signal as input and generating a third pseudo signal;

a third subtractor for generating a third differential signal by subtracting said third pseudo signal from said first signal and supplying said third differential signal to said first adaptive filter as said first intermediate signal;

a fourth adaptive filter for taking said second differential signal as input and generating a fourth pseudo signal;

a fourth subtractor for generating a fourth differential signal by subtracting said fourth pseudo signal from said first signal and supplying said fourth differential signal to said second adaptive filter as said second intermediate signal; and a step size control means for, based on relation between signals, generating a first step size, a second step size, a third step size, and a fourth step size;

wherein said first differential signal and said first step size are used to update a coefficient of said first adaptive filter; said second differential signal and said second step size are used to update a coefficient of said second adaptive filter; said third differential signal and said third step size are used to update a coefficient of said third adaptive filter; said fourth differential signal and said fourth step size are used to update a coefficient of said fourth adaptive filter; and said first differential signal is supplied as output, and wherein said step size control means comprises:

a first step size control circuit for generating said first step size in accordance with the relation between said fourth pseudo signal and said fourth differential signal;

a second step size control circuit for generating said second step size in accordance with the relation between said first signal and said second signal;

a third step size control circuit for generating said third step size in accordance with the relation between said fourth pseudo signal and said fourth differential signal; and a fourth step size control circuit for generating said fourth step size in accordance with the relation between said first signal and said second signal.

37. The signal processor according to claim 36 further comprising:

a first delay circuit for conferring a delay to said first signal that is applied as input to said third subtractor; and a second delay circuit for conferring a delay to said second signal that is applied as input to said first subtractor.

38. The signal processor according to claim 36 further comprising:

a first delay circuit for delaying said first signal that is applied as input to said third subtractor; and a second delay circuit for delaying said second signal that is applied as input to said first subtractor.

39. The signal processor according to claim 36 further comprising:

a first decimation circuit for decimating said first signal that is applied as input to said fourth subtractor; and a second decimation circuit for decimating said second signal that is applied as input to said second subtractor.

40. A signal processor for receiving a first signal and a second signal as input and canceling noise, said signal processor comprising:

a first adaptive filter for taking a first intermediate signal as input and generating a first pseudo signal;

a first subtractor for generating a first differential signal by subtracting said first pseudo signal from said second signal;

a second adaptive filter for taking a second intermediate signal as input and generating a second pseudo signal;

a second subtractor for generating a second differential signal by subtracting said second pseudo signal from said second signal;

a third adaptive filter for taking said first differential signal as input and generating a third pseudo signal;

a third subtractor for generating a third differential signal by subtracting said third pseudo signal from said first signal and supplying said third differential signal to said first adaptive filter as said first intermediate signal;

a fourth adaptive filter for taking said second differential signal as input and generating a fourth pseudo signal;

a fourth subtractor for generating a fourth differential signal by subtracting said fourth pseudo signal from said first signal and supplying said fourth differential signal to said second adaptive filter as said second intermediate signal; and a step size control means for, based on relation between signals, generating a first step size, a second step size, a third step size, and a fourth step size;

wherein said first differential signal and said first step size are used to update a coefficient of said first adaptive filter; said second differential signal and said second step size are used to update a coefficient of said second adaptive filter; said third differential signal and said third step size are used to update a coefficient of said third adaptive filter; said fourth differential signal and said fourth step size are used to update a coefficient of said fourth adaptive filter; and said first differential signal is supplied as output, wherein said step size control means comprises:

a first step size control circuit for generating said first step size in accordance with the relation between said second pseudo signal and said second differential signal;

a second step size control circuit for generating said second step size in accordance with the relation between said first signal and said second signal;

a third step size control circuit for generating said third step size in accordance with the relation between said fourth pseudo signal and said fourth differential signal; and a fourth step size control circuit for generating said fourth step size in accordance with the relation between said first signal and said second signal, and wherein said first signal is a first received sound signal received as input from a speech input terminal;

said second signal is a second received sound signal received as input from a reference input terminal;

said first step size control circuit supplies a large step size to said first adaptive filter to speed convergence when it is determined based on signal-to-noise relation in said first received sound signal that a noise signal is greater than a speech signal in said first received sound signal, and supplies a small step size to said first adaptive filter when it is determined that a noise signal is smaller than a speech signal in said first received sound signal;

said second step size control circuit supplies a large step size to said second adaptive filter to speed convergence when it is determined based on signal-to-noise relation in said second received sound signal that a speech signal is greater than a noise signal in said second received sound signal; and supplies a small step size to said second adaptive filter when it is determined that a speech signal is smaller than a noise signal;

said third step size control circuit supplies a large step size to said third adaptive filter to speed convergence when it is determined based on the signal-to-noise relation in said first received sound signal that a noise signal is greater than a speech signal in said first received sound signal, and supplies a small step size to said third adaptive filter when it is determined that a noise signal is smaller than a speech signal in said first received sound signal; and said fourth step size control circuit supplies a large step size to said fourth adaptive filter to speed convergence when it is determined based on the signal-to-noise relation in said second received sound signal that a speech signal is greater than a noise signal in said second received sound signal, and supplies a small step size to said fourth adaptive filter when it is determined that a speech signal is smaller than a noise signal.

41. The signal processor according to claim 40 further comprising:
   a first delay circuit for conferring a delay to said first signal that is applied as input to said third subtractor; and
   a second delay circuit for conferring a delay to said second signal that is applied as input to said first subtractor.

42. A signal processor for receiving a first signal and a second signal as input, said signal processor comprising:
   a first adaptive filter for taking a first intermediate signal as input and generating a first pseudo signal;
   a first subtractor for generating a first differential signal by subtracting said first pseudo signal from said second signal;
   a second adaptive filter for taking a second intermediate signal as input and generating a second pseudo signal;
   a second subtractor for generating a second differential signal by subtracting said second pseudo signal from said second signal;
   a third adaptive filter for taking said first differential signal as input and generating a third pseudo signal;
   a third subtractor for generating a third differential signal by subtracting said third pseudo signal from said first signal and supplying said third differential signal to said first adaptive filter as said first intermediate signal;
   a fourth adaptive filter for taking said second differential signal as input and generating a fourth pseudo signal;
   a fourth subtractor for generating a fourth differential signal by subtracting said fourth pseudo signal from said first signal and supplying said fourth differential signal to said second adaptive filter as said second intermediate signal; and
   a step size control means for, based on relation between signals, generating a first step size, a second step size, a third step size, and a fourth step size;
   wherein said first differential signal and said first step size are used to update a coefficient of said first adaptive filter; said second differential signal and said second step size are used to update a coefficient of said second adaptive filter; said third differential signal and said third step size are used to update a coefficient of said third adaptive filter; said fourth differential signal and said fourth step size are used to update a coefficient of said fourth adaptive filter; and said first differential signal is supplied as output,
   wherein said step size control means comprises:
   a first step size control circuit for generating said first step size in accordance with the relation between said second pseudo signal and said second differential signal;
   a second step size control circuit for generating said second step size in accordance with the relation between said first signal and said second signal;
   a third step size control circuit for generating said third step size in accordance with the relation between said fourth pseudo signal and said fourth differential signal; and
   a fourth step size control circuit for generating said fourth step size in accordance with the relation between said first signal and said second signal, and
   wherein the signal processor further comprises:
   first thinning means for thinning out said first signal that is applied as input to said fourth subtractor; and
   second thinning means for thinning out said second signal that is applied as input to said second subtractor;
   wherein the relation between said first signal following thinning and said second signal following thinning is used as said relation between said first signal and said second signal.

43. The signal processor according to claim 42 further comprising:
   a first delay circuit for conferring a delay to said first signal that is applied as input to said third subtractor; and
   a second delay circuit for conferring a delay to said second signal that is applied as input to said first subtractor.

44. The signal processor according to claim 42 for canceling noise, wherein:
   said first signal is a first received sound signal received as input from a speech input terminal;
   said second signal is a second received sound signal received as input from a reference input terminal;
   said first step size control circuit supplies a large step size to said first adaptive filter to speed convergence when it is determined based on signal-to-noise relation in said first received sound signal that a noise signal is greater than a speech signal in said first received sound signal, and supplies a small step size to said first adaptive filter when it is determined that a noise signal is smaller than a speech signal in said first received sound signal;
   said second step size control circuit supplies a large step size to said second adaptive filter to speed convergence when it is determined based on signal-to-noise relation in said second received sound signal that a speech signal is greater than a noise signal in said second received sound signal; and supplies a small step size to said second adaptive filter when it is determined that a speech signal is smaller than a noise signal;
   said third step size control circuit supplies a large step size to said third adaptive filter to speed convergence when it is determined based on the signal-to-noise relation in said first received sound signal that a noise signal is greater than a speech signal in said first received sound signal, and supplies a small step size to said third adaptive filter when it is determined that a noise signal is smaller than a speech signal in said first received sound signal; and
   said fourth step size control circuit supplies a large step size to said fourth adaptive filter to speed convergence when it is determined based on the signal-to-noise relation in said second received sound signal that a speech signal is greater than a noise signal in said second received sound signal, and supplies a small step size to said fourth adaptive filter when it is determined that a speech signal is smaller than a noise signal.

45. The signal processor according to claim 42 further comprising:
 a first delay circuit for delaying said first signal that is applied as input to said third subtractor; and
 a second delay circuit for delaying said second signal that is applied as input to said first subtractor.

46. The signal processor according to claim 42 further comprising:
 a first decimation circuit for decimating said first signal that is applied as input to said fourth subtractor; and
 a second decimation circuit for decimating said second signal that is applied as input to said second subtractor.

* * * * *